(12) United States Patent
Yim et al.

(10) Patent No.: US 12,148,729 B2
(45) Date of Patent: Nov. 19, 2024

(54) SEMICONDUCTOR PACKAGE STRUCTURE HAVING INTERPOSER SUBSTRATE, AND STACKED SEMICONDUCTOR PACKAGE STRUCTURE INCLUDING THE SAME

(71) Applicant: Samsung Electronics Co., Ltd., Suwon-si (KR)

(72) Inventors: Choongbin Yim, Seoul (KR); Jihwang Kim, Cheonan-si (KR); Jongbo Shim, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 320 days.

(21) Appl. No.: 17/577,653

(22) Filed: Jan. 18, 2022

(65) Prior Publication Data
US 2022/0352110 A1  Nov. 3, 2022

(30) Foreign Application Priority Data
May 3, 2021  (KR) .......................... 10-2021-0057483

(51) Int. Cl.
*H01L 23/00* (2006.01)
*H01L 23/498* (2006.01)
*H01L 25/10* (2006.01)

(52) U.S. Cl.
CPC ........ *H01L 24/32* (2013.01); *H01L 23/49816* (2013.01); *H01L 23/49833* (2013.01); *H01L 23/49838* (2013.01); *H01L 24/16* (2013.01); *H01L 25/105* (2013.01); *H01L 24/73* (2013.01); *H01L 2224/16227* (2013.01); *H01L 2224/16235* (2013.01); *H01L 2224/32057* (2013.01); *H01L 2224/32225* (2013.01); *H01L 2224/73204* (2013.01)

(58) Field of Classification Search
CPC ... H01L 24/32; H01L 24/16; H01L 23/49816; H01L 23/49833; H01L 23/49838; H01L 25/105; H01L 2224/32225; H01L 2224/32057; H01L 2224/16235; H01L 2224/16227; H01L 2224/73204
USPC ........................................................ 257/773
See application file for complete search history.

(56) References Cited

U.S. PATENT DOCUMENTS

| | | |
|---|---|---|
| 7,129,584 B2 | 10/2006 | Lee |
| 7,843,050 B2 | 11/2010 | Eng et al. |
| 8,383,457 B2 | 2/2013 | Pagaila et al. |
| 9,214,454 B2 | 12/2015 | Haba et al. |
| 9,379,090 B1 | 6/2016 | Syed et al. |
| 10,062,670 B2 | 8/2018 | Frenette et al. |
| 10,431,536 B2 | 10/2019 | Kim et al. |
| 2015/0221570 A1 | 8/2015 | Berry et al. |

(Continued)

*Primary Examiner* — Jasmine J Clark
(74) *Attorney, Agent, or Firm* — Muir Patent Law, PLLC

(57) ABSTRACT

A semiconductor package structure includes a package substrate; a semiconductor chip on the package substrate and electrically connected to the package substrate; an interposer substrate above the package substrate and the semiconductor chip, wherein the interposer substrate includes a cavity recessed inward from a lower surface thereof, wherein the semiconductor chip is positioned within the cavity, at least from a plan view; and an adhesive layer positioned inside and outside the cavity, wherein the adhesive layer is formed on all of upper and side surfaces of the semiconductor chip, or on the side surfaces of the semiconductor chip.

19 Claims, 28 Drawing Sheets

(56) References Cited

U.S. PATENT DOCUMENTS

2019/0198437 A1* 6/2019 Kim .................. H01L 23/49811
2020/0105544 A1 4/2020 Tsai et al.

* cited by examiner

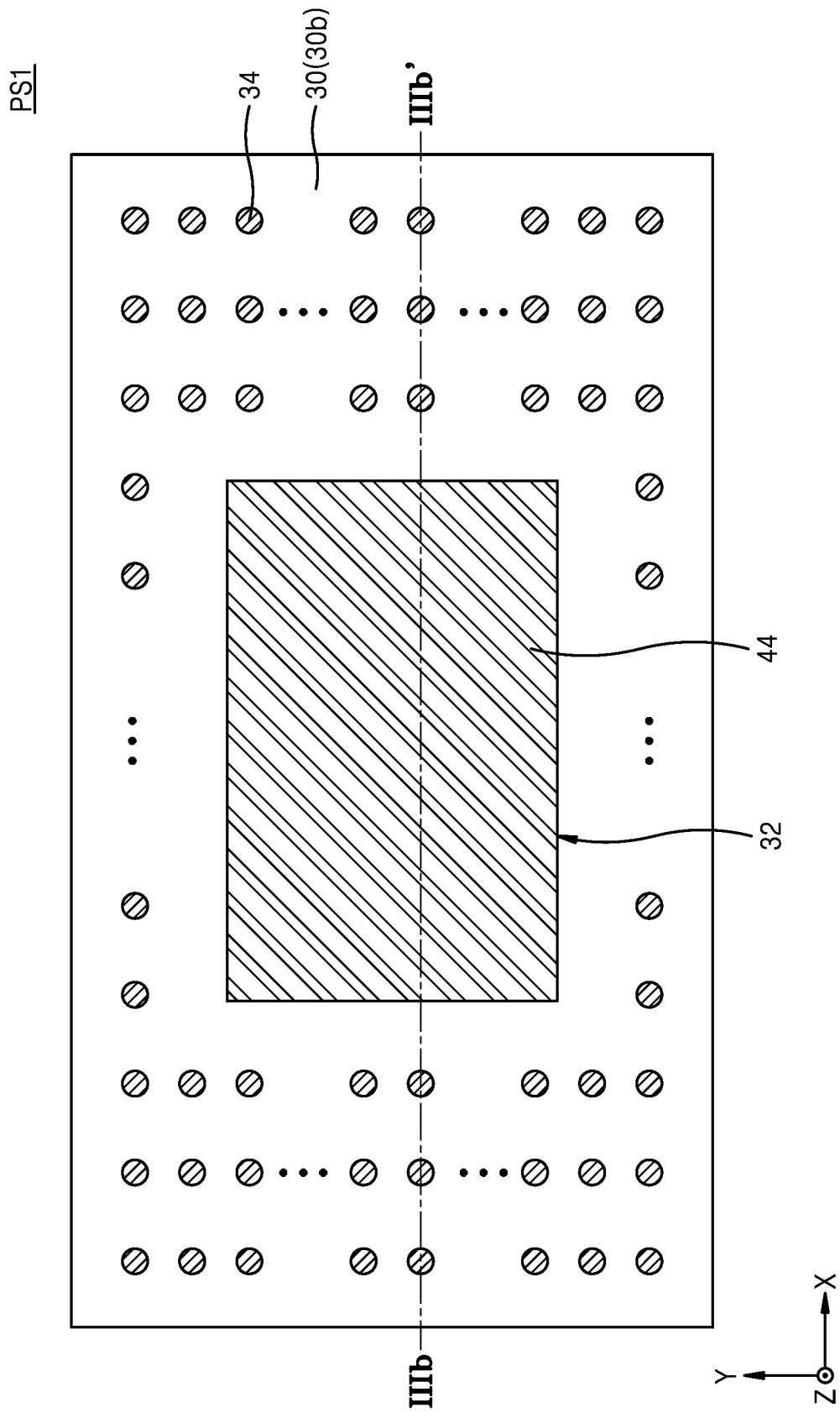

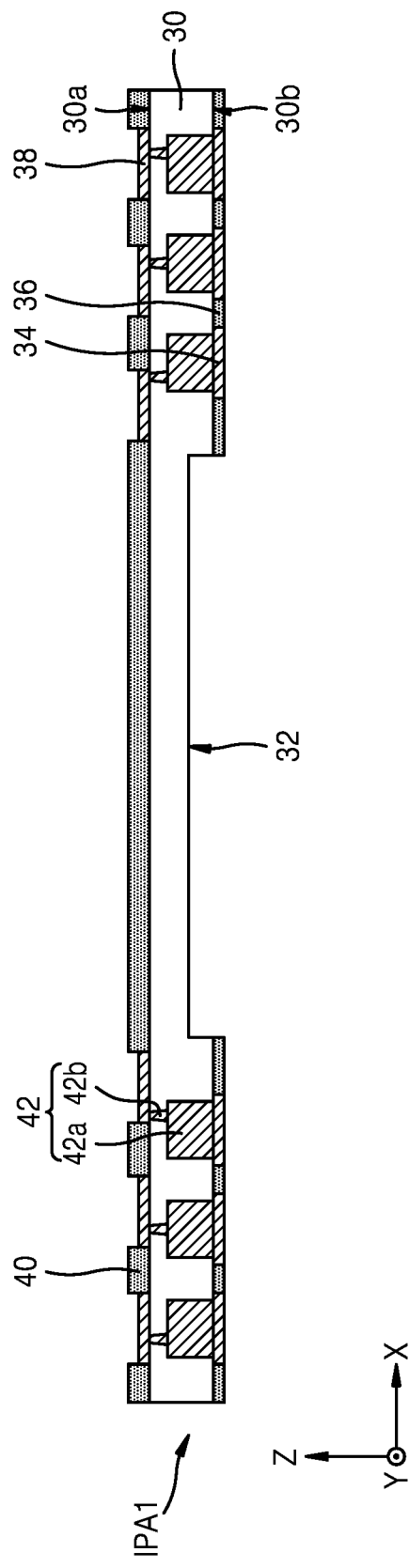
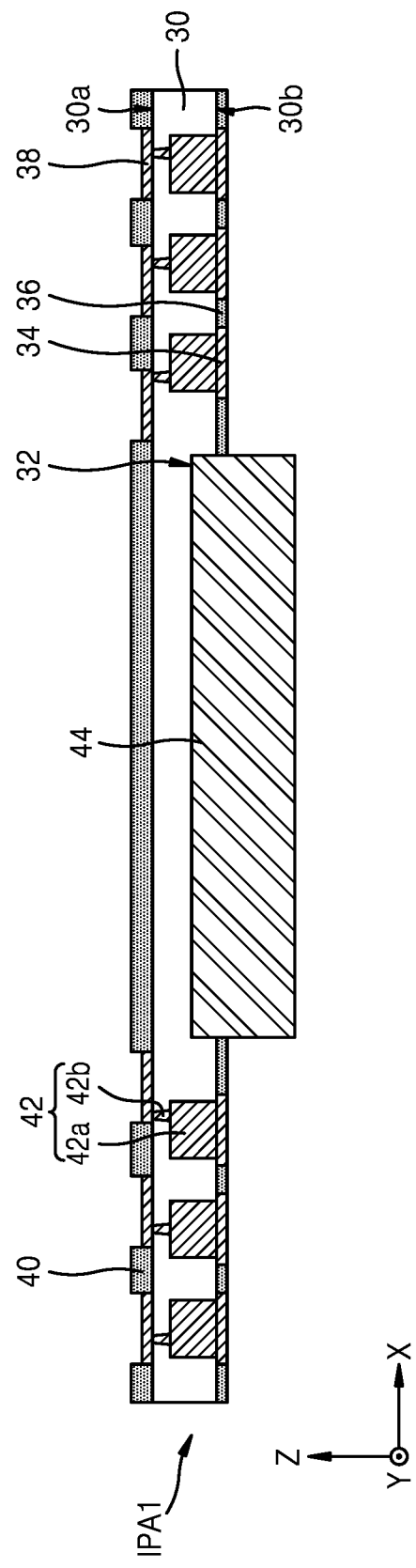

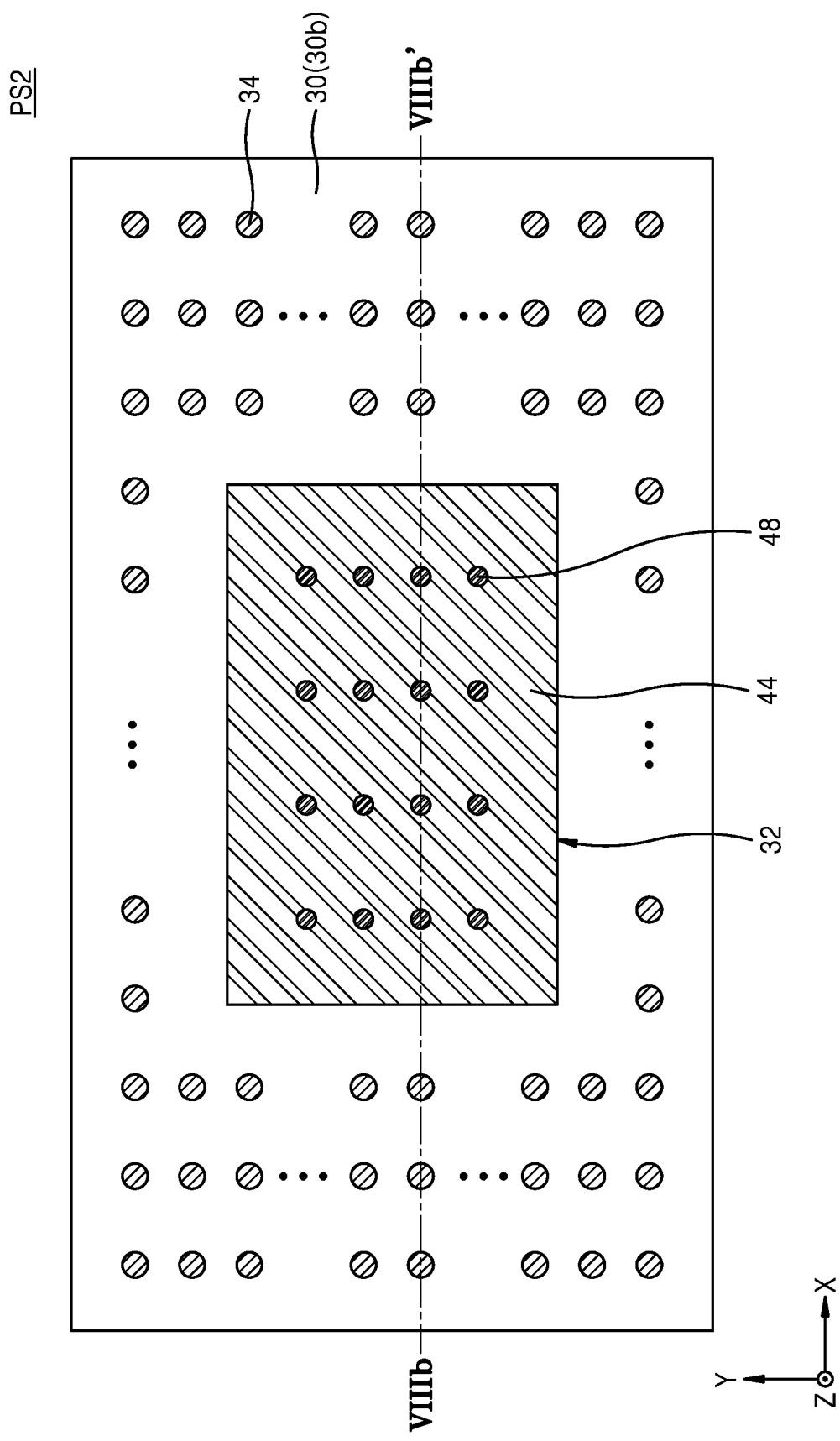

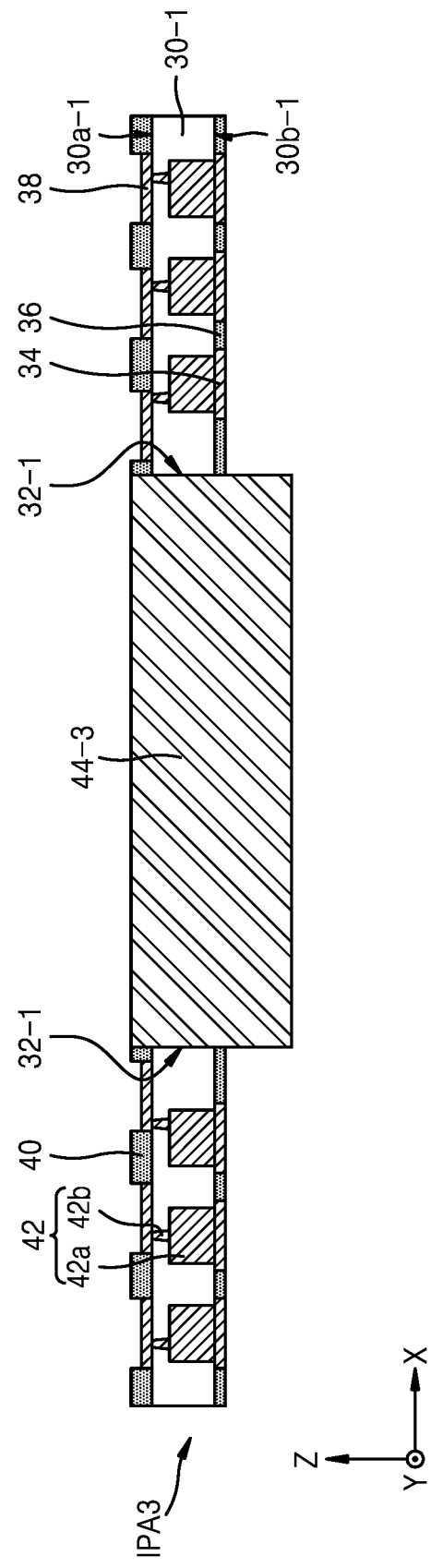
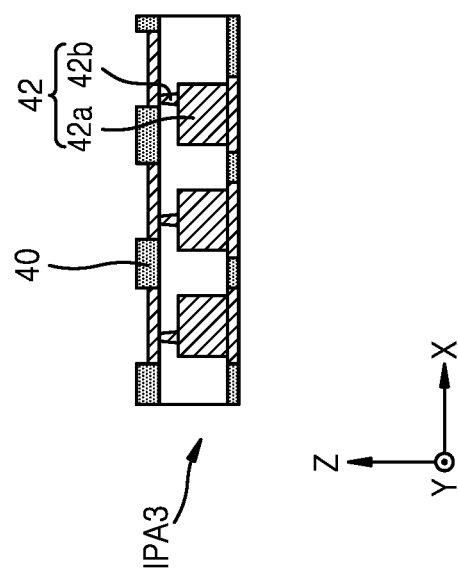

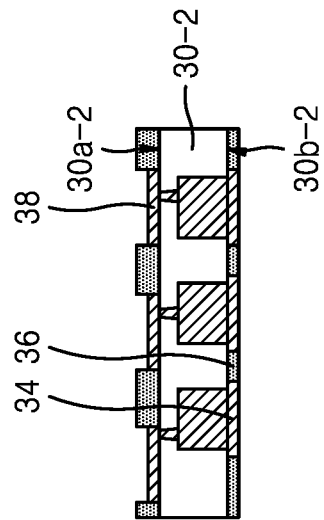
FIG. 16A
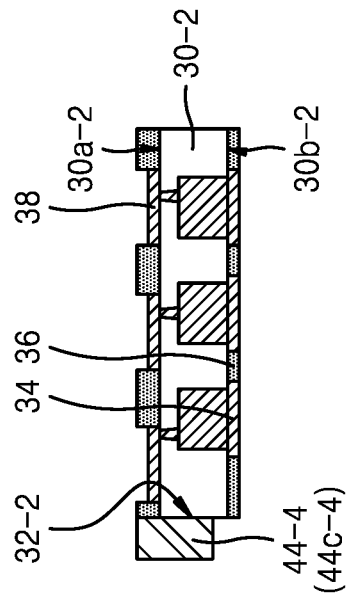
FIG. 16B
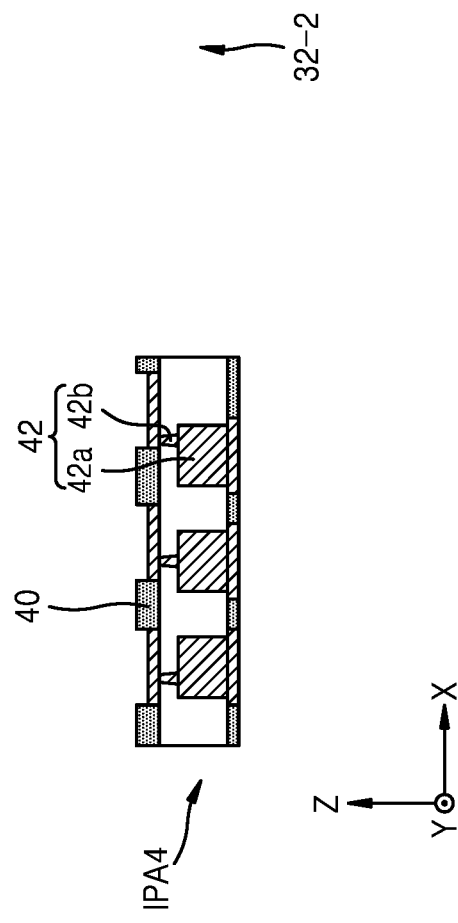
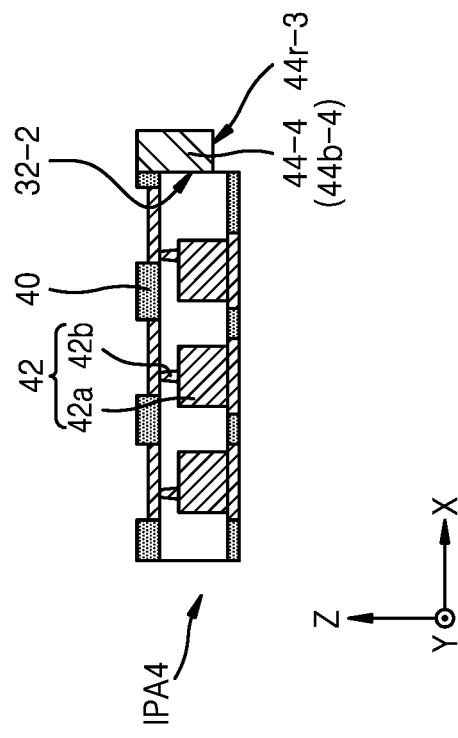

SEMICONDUCTOR PACKAGE STRUCTURE HAVING INTERPOSER SUBSTRATE, AND STACKED SEMICONDUCTOR PACKAGE STRUCTURE INCLUDING THE SAME

CROSS-REFERENCE TO RELATED APPLICATION

This application is based on and claims priority under 35 U.S.C. § 119 to Korean Patent Application No. 10-2021-0057483, filed on May 3, 2021, in the Korean Intellectual Property Office, the disclosure of which is incorporated by reference herein in its entirety.

BACKGROUND

The inventive concept relates to a semiconductor package structure and a stacked semiconductor package structure including the same, and more particularly, to a semiconductor package structure having an interposer substrate and a stacked semiconductor package structure including the same.

With the development of the electronics industry, the demand for high functionalization and miniaturization of electronic components is rapidly increasing. In order to respond to this trend, a semiconductor package structure in which a plurality of semiconductor chips are stacked on one package substrate or an interposer substrate is sandwiched between the semiconductor chips has been proposed. In addition, a stacked semiconductor package structure in which a second semiconductor package structure is stacked on a first semiconductor package structure has been proposed.

SUMMARY

Various aspects of the inventive concept provide a semiconductor package structure having a small thickness and capable of improving adhesion reliability between an interposer substrate and a semiconductor chip.

Embodiments of the inventive concept provide a stacked semiconductor package structure in which a second semiconductor package structure is stacked on a first semiconductor package structure.

According to an aspect of the inventive concept, a semiconductor package structure includes a package substrate; a semiconductor chip on the package substrate and electrically connected to the package substrate; an interposer substrate above the package substrate and the semiconductor chip, wherein the interposer substrate includes a cavity recessed inward from a lower surface thereof, wherein the semiconductor chip is positioned within the cavity, at least from a plan view; and an adhesive layer positioned inside and outside the cavity, wherein the adhesive layer is formed on all of upper and side surfaces of the semiconductor chip, or on the side surfaces of the semiconductor chip.

According to another aspect of the inventive concept, a semiconductor package includes a semiconductor chip mounting structure including a package substrate, a semiconductor chip on the package substrate, and lower connection bumps on the package substrate and surrounding the semiconductor chip. The semiconductor package includes an interposer adhesive structure attached onto the semiconductor chip mounting structure, wherein the interposer adhesive structure includes an interposer substrate having a cavity recessed inward from a lower surface thereof and corresponding to the semiconductor chip; an adhesive layer positioned inside and outside the cavity and on all of upper and opposite side surfaces of the semiconductor chip, or on the opposite side surfaces of the semiconductor chip; and an upper connection bump electrically connected to the lower connection bump on the interposer substrate and surrounding the cavity. The semiconductor package includes a molding layer sealing between the semiconductor chip mounting structure and the interposer adhesive structure.

According to another aspect of the inventive concept, a stacked semiconductor package includes a stacked semiconductor package structure including a first semiconductor package structure; and a second semiconductor package structure on the first semiconductor package structure. The first semiconductor package structure includes a first package substrate; a first semiconductor chip on the first package substrate and electrically connected to the first package substrate; an interposer substrate above the first package substrate and the first semiconductor chip, wherein the interposer substrate includes a cavity recessed inward from a lower surface thereof, and wherein the first semiconductor chip is positioned to correspond to the cavity; and an adhesive layer positioned inside and outside the cavity, wherein the adhesive layer is formed on all of upper and at least two side surfaces of the first semiconductor chip, or on the at least two side surfaces of the first semiconductor chip.

The second semiconductor package structure includes a second package substrate; an external connection bump on a lower surface of the second package substrate and electrically connected to the interposer substrate; and a second semiconductor chip positioned on an upper surface of the second package substrate and electrically connected to the second package substrate.

BRIEF DESCRIPTION OF THE DRAWINGS

Embodiments of the inventive concept will be more clearly understood from the following detailed description taken in conjunction with the accompanying drawings in which:

FIG. 2 is a layout diagram illustrating an arrangement of an interposer substrate and an adhesive layer of FIG. 1A, according to an embodiment of the inventive concept;

FIGS. 3A and 3B are cross-sectional views illustrating an interposer adhesive structure of FIGS. 1A and 1B, according to an embodiment of the inventive concept;

FIG. 7 is a layout diagram illustrating an arrangement of an interposer substrate, an adhesive layer, and patch patterns of FIG. 6A, according to an embodiment of the inventive concept;

FIGS. 12A and 12B are cross-sectional views illustrating an interposer adhesive structure of FIGS. 10A and 10B, according to an embodiment of the inventive concept;

FIGS. 16A and 16B are cross-sectional views illustrating an interposer adhesive structure of FIGS. 14A and 14B, according to an embodiment of the inventive concept;

DETAILED DESCRIPTION OF THE EMBODIMENTS

Hereinafter, embodiments will be described in detail with reference to the accompanying drawings. Though specific embodiments are described, aspects or features of the various embodiments may be combined. Therefore, it is not construed that the inventive concept is limited to the features of any one embodiment.

As used herein, the singular forms "a", "an" and "the" are intended to include the plural forms as well, unless the context clearly indicates otherwise. Herein, the drawings are exaggerated and illustrated for clearly describing embodiments.

Figure 1A:
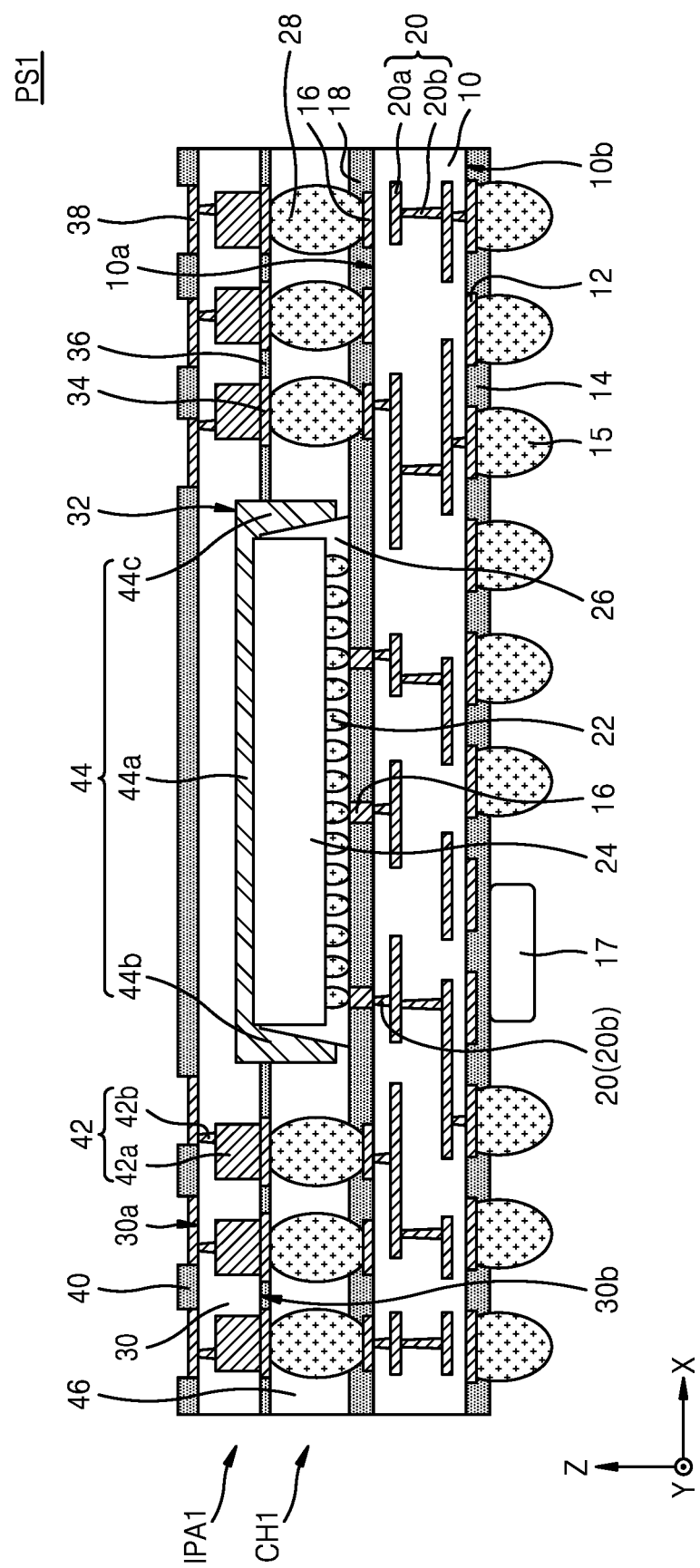
FIG. 1A is a cross-sectional view illustrating a semiconductor package structure according to an embodiment of the inventive concept.
Figure 1B:
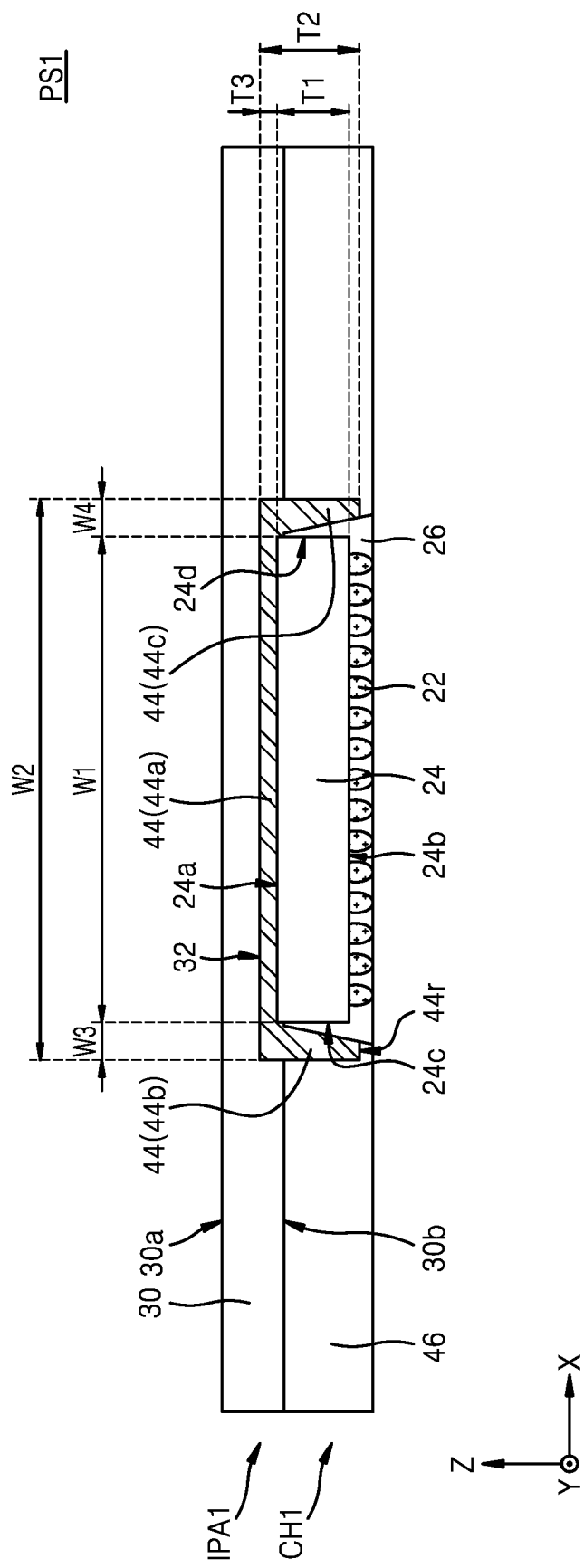
FIG. 1B is a cross-sectional view illustrating some components of FIG. 1A.

FIG. 1A is a cross-sectional view illustrating a semiconductor package structure PS1 according to an embodiment of the inventive concept, FIG. 1B is a cross-sectional view illustrating some components of FIG. 1A, and FIG. 2 is a layout diagram illustrating an arrangement of an interposer substrate 30 and an adhesive layer 44 of FIG. 1A.

Specifically, FIG. 1A is a cross-sectional view illustrating the entire configuration of the semiconductor package structure PS1. The semiconductor package structures described herein may be semiconductor packages, or part of semiconductor packages. FIG. 1B is a cross-sectional view illustrating the interposer substrate 30, a semiconductor chip 24, and the adhesive layer 44 of FIG. 1A. FIGS. 1A and 1B each show an X-Z cross-sectional view taken along the X-axis and the Z-axis. FIG. 2 shows an interposer lower connection pad 34 positioned on a lower surface 30b of the interposer substrate 30 of FIG. 1A, and the adhesive layer 44 positioned on a cavity 32 provided in the lower surface 30b of the interposer substrate 30. FIG. 2 shows an X-Y layout diagram along the X-axis and the Y-axis.

The semiconductor package structure PS1 may include a semiconductor chip mounting structure CH1, an interposer adhesive structure IPA1 attached on the semiconductor chip mounting structure CH1, and a molding layer 46 sealing between the semiconductor chip mounting structure CH1 and the interposer adhesive structure IPA1 as shown in FIG. 1A.

The semiconductor chip mounting structure CH1 may include a package substrate 10. The package substrate 10 may be, for example, a printed circuit board (PCB). The PCB may be a rigid PCB or a flexible PCB.

The package substrate 10 may be formed of or may include a phenol resin, an epoxy resin, a polyimide, or a combination thereof. For example, the package substrate 10 may be formed of or may include flame retardant 4 (FR4), tetrafunctional epoxy, polyphenylene ether, epoxy/polyphenylene oxide, bismaleimide triazine (BT), Thermount®, cyanate ester, polyimide, or liquid crystal polymer.

The package substrate 10 may include an upper surface 10a and a lower surface 10b. A package wiring layer 20 may be included in the package substrate 10. The package wiring layer 20 may include package base wiring layers 20a (also described as package horizontal wiring layers) and one or more package via wiring layers 20b (also described as package vertical wiring layers) electrically connecting between the package base wiring layers 20a. The package wiring layer 20 may be formed of or may include copper (Cu), nickel (Ni), aluminum (Al), silver (Ag), gold (Au), or a combination thereof.

A package upper connection pad 16 and a package lower connection pad 12 may be respectively disposed on the upper surface 10a and the lower surface 10b of the package substrate 10. The package upper connection pad 16, also described as a package substrate upper connection pad, and the package lower connection pad 12, also described as a package substrate lower connection pad may be formed of or may include copper (Cu), nickel (Ni), aluminum (Al), silver (Ag), gold (Au), or a combination thereof. The various pads described herein may be connected to internal circuitry within the device to which they are connected, and may transmit signals and/or supply voltages to and/or from the device to which they are attached. The various pads described herein may generally have a planar surface at a location for connecting to a terminal for external communications outside of the device to which the pads are connected.

A package upper protective layer 18 insulating between the package upper connection pads 16 may be positioned on the upper surface 10a of the package substrate 10. A package lower protective layer 14 insulating between the package lower connection pads 12 may be positioned on the lower surface 10b of the package substrate 10. The package upper protective layer 18, also described as a package substrate upper protective layer, and the package lower protective layer 14, also described as a package substrate lower protective layer, may be solder resist layers.

In some embodiments, the package substrate 10 may be referred to as a package substrate base layer. When the package substrate 10 is referred to as the package substrate base layer, the package substrate base layer, the package upper connection pad 16, the package lower connection pad 12, the package upper protective layer 18, the package lower protective layer 14, and the package wiring layer 20 may be collectively referred to as a package substrate.

The semiconductor chip mounting structure CH1 may include an external connection bump 15, more generally referred to as an external connection terminal, or package external connection terminal, and a decoupling capacitor 17. The external connection bump 15 may be attached on the package lower connection pad 12. The external connection bump 15 may be electrically connected to a motherboard or an external device. The external connection bump 15 may be, for example, a solder ball. The decoupling capacitor 17 may be selectively installed to improve a power integrity (PI) characteristic of the semiconductor package structure PS1. It should be noted that although certain items are described in the singular, such as an external connection bump 15 above, as can be seen in the various drawings, these items may be included in plural.

The semiconductor chip mounting structure CH1 may include a semiconductor chip 24, a chip connection bump 22, an underfill layer 26, and a connection bump 28. The semiconductor chip 24 may be attached on the package substrate 10. For example, the semiconductor chip 24 may be attached on the package upper protective layer 18 and the package upper connection pads 16 on the package substrate 10.

The semiconductor chip 24 may be electrically connected to the package substrate 10 through the chip connection bump 22, also described as a chip external connection terminal. The semiconductor chip 24 may be electrically connected to the package wiring layer 20 through the chip connection bump 22. The chip connection bump 22 may be, for example, a solder ball. The chip connection bump 22 may be formed of gold (Au), copper (Cu), nickel (Ni), tin (Sn), lead (Pb), or a combination thereof.

The semiconductor chip 24 may be a logic chip or a memory chip. In some embodiments, the logic chip may be a memory controller chip, a central processing unit (CPU) chip, a graphics processing unit (GPU) chip, or an application processor (AP) chip. The semiconductor chip 24 may be a die formed form a wafer, and including an integrated circuit. In some embodiments, the semiconductor chip 24 may be part of a stack of chips.

In some embodiments, the memory chip may be a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip.

The semiconductor chip 24 may include an upper surface 24a (also described as a top surface), a lower surface 24b (also described as a bottom surface), and opposite side surfaces 24c and 24d as shown in FIG. 1B. The semiconductor chip 24 may have a first width W1 (e.g., horizontal width in a first direction such as the X direction, which may also be the width in the Y direction). In some embodiments, the first width W1 may be about 8 mm to about 10 mm. The semiconductor chip 24 may have a first thickness T1 (e.g., in a vertical direction, i.e., the Z direction). In some embodiments, the first thickness T1 may be about 30 μm to about 500 μm. In some embodiments, the first thickness T1 may be about 100 μm to about 200 μm.

The underfill layer 26 may be formed between the opposite side surfaces 24c and 24d of the semiconductor chip 24, and between an upper portion of the package upper protective layer 18 of the package substrate 10 and the chip connection bumps 22 as shown in FIG. 1B. The underfill layer 26 is for reliably attaching the semiconductor chip 24 to the package substrate 10, and may not be formed in some embodiments.

The connection bumps 28 may be formed on the package substrate 10 around the semiconductor chip 24 (e.g., to surround four sides of the semiconductor chip 24 from a plan view). Each connection bump 28 may be divided into a lower connection bump (28a in FIG. 4) and an upper connection bump (28b in FIG. 4), as will be described later. The semiconductor chip mounting structure CH1 may include a lower connection bump (28a of FIG. 4). The connection bump 28 may be, for example, a solder ball. The connection bump 28 may be formed of or may include gold (Au), copper (Cu), nickel (Ni), tin (Sn), lead (Pb), or a combination thereof.

The interposer adhesive structure IPA1 may include the interposer substrate 30 and the adhesive layer 44. The interposer substrate 30 may be formed of or may include an organic material, glass, ceramic, or a semiconductor. In some embodiments, the interposer substrate 30 may be formed of or may include silicon (Si). The interposer substrate 30 may be a substrate in which an active element, for example, a transistor, is not formed, or in which no active elements are formed.

The interposer substrate 30 may include an upper surface 30a and a lower surface 30b as shown in FIGS. 1A and 1B. The interposer substrate 30 may include a cavity 32 recessed inward from the lower surface 30b to correspond to the semiconductor chip 24. The cavity 32 may include or may be in the form of a groove, a hole, etc. An upper portion of the semiconductor chip 24 may be partially positioned in the cavity 32. In some embodiments, the upper portion of the semiconductor chip 24 may be partially positioned outside the cavity 32.

The cavity 32 may have a second width W2 (e.g., horizontal width in the X direction, which may also be the width in the Y direction). The second width W2 of the cavity 32 may be greater than the first width W1 of the semiconductor chip 24. In some embodiments, the second width W2 may be about 10 mm to about 12 mm and may be about 15% to 30% greater than the first width W1, or in some cases between 20% and 25% greater than the first width. The semiconductor chip 24 may be disposed to correspond to the cavity 32 positioned in the interposer substrate 30, and thus, the total thickness of the semiconductor package structure PS1 may be reduced.

An interposer wiring layer 42 may be included in the interposer substrate 30. The interposer wiring layer 42 may include an interposer base wiring layer 42a and an interposer via wiring layer 42b electrically connected to the interposer base wiring layer 42a. The interposer wiring layer 42 may be formed of or may include copper (Cu), nickel (Ni), aluminum (Al), silver (Ag), gold (Au), or a combination thereof.

An interposer upper connection pad 38 and an interposer lower connection pad 34 may be disposed on the upper surface 30a and the lower surface 30b of the interposer substrate 30, respectively. The interposer upper connection pad 38 and the interposer lower connection pad 34 may be disposed around the cavity 32. The interposer upper connection pad 38 and the interposer lower connection pad 34 may be formed of or may include copper (Cu), nickel (Ni), aluminum (Al), silver (Ag), gold (Au), or a combination thereof.

An interposer upper protective layer 40, also described as an interposer upper passivation layer, insulating between the interposer upper connection pads 38 may be positioned on the upper surface 30a of the interposer substrate 30. An interposer lower protective layer 36, also described as an interposer lower passivation layer, insulating between the interposer lower connection pads 34 may be positioned on the lower surface 30b of the interposer substrate 30. The interposer upper protective layer 40 and the interposer lower protective layer 36 may be, for example, solder resist layers.

In some embodiments, the interposer substrate 30 may be referred to as an interposer substrate base layer. When the interposer substrate 30 is referred to as the interposer substrate base layer, the interposer substrate base layer, the interposer upper connection pad 38, the interposer lower connection pad 34, the interposer upper protective layer 40, the interposer lower protective layer 36, and the interposer wiring layer 42 may be collectively referred to as an interposer substrate.

The adhesive layer 44 may be positioned inside and outside the cavity 32 as shown in FIGS. 1A and 1B, and also formed on the upper surface 24a and the both side surfaces 24c and 24d of the semiconductor chip 24. A lower (e.g., lowermost) surface 44r of the adhesive layer 44 formed on the both side surfaces 24c and 24d of the semiconductor chip 24 may be positioned lower than the lower surface 24b of the semiconductor chip 24.

The adhesive layer 44 may have a second thickness T2. The second thickness T2 may be, for example, 10 μm to 300 μm. The adhesive layer 44 may include an upper adhesive layer 44a formed on the upper surface of the semiconductor chip 24, and a first side adhesive layer 44b and a second side adhesive layer 44c respectively formed on the both side surfaces 24c and 24d of the semiconductor chip 24. The upper adhesive layer 44a may be referred to as an upper adhesive layer portion or a first adhesive layer portion, and each of the side adhesive layers 44b and 44c may be referred to as a side adhesive layer portion or as second and third adhesive layer portions respectively. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The adhesive layer 44 may be or may include a die attachment film (DAF) or a film on die (FOD). The adhesive layer 44 may be or may include a thermosetting resin. The adhesive layer 44 may be formed by curing a semi-curable (B-Stage) thermosetting resin. The adhesive layer 44 may be an epoxy-based organic material. The adhesive layer 44 may be provided by adhering he thermosetting resin on the upper surface 24a and both side surfaces 24c and 24d of the semiconductor chip 24, e.g., impregnating or infiltrating the thermosetting resin on the upper surface 24a and both side surfaces 24c and 24d of the semiconductor chip 24. The adhesive layer 44 may be an electrically insulating material.

The upper adhesive layer 44a may have a third thickness T3. The upper adhesive layer 44a may have the third thickness T3 from the upper surface 24a of the semiconductor chip 24. In some embodiments, the third thickness T3 may be 5 μm to 30 μm.

The upper adhesive layer 44a may be configured in the form of a film to prevent a void from being generated in the upper adhesive layer 44a. Accordingly, in the semiconductor package structure PS1, the semiconductor chip 24 and the interposer substrate 30 may be reliably bonded to each other by using the upper surface adhesive layer 44a.

The first side adhesive layer 44b and the second side adhesive layer 44c may have a third width W3 and a fourth width W4 extending from the respective side surfaces 24c and 24d of the semiconductor chip 24. In other words, the adhesive layer 44 may have the third width W3 from one side surface 24c and the fourth width W4 from the other side surface 24d of the semiconductor chip 24. The third width W3 and the fourth width W4 may have the same value. In some embodiments, the third width W3 and the fourth width W4 may be equal to or less than 1 mm. Accordingly, the first side adhesive layer 44b and the second side adhesive layer 44c may have a symmetrical structure with respect to the semiconductor chip 24. It should be noted that although only one view is shown (e.g., the X-Z cross-sectional view taken along the X-axis and the Z-axis), four side adhesive layers may be formed, one on each side of the semiconductor chip 24. Collectively, the four side adhesive layers may be referred to as a side adhesive layer. Each of the two side adhesive layers not shown in FIG. 1B may have the same size and shape as the first side adhesive layer 44b and second side adhesive layer 44c shown. The adhesive layer 44, including the upper adhesive layer 44a and any side adhesive layers, may be formed of an integral piece including a continuous material. The adhesive layer 44 may contact the upper surface 24a of the semiconductor chip 24 and may cover the side surfaces of the semiconductor chip 24. In some embodiments, the underfill layer 26 does not cover the entire side surfaces of the semiconductor chip 24, or does not cover any of the side surfaces of the semiconductor chip 24, or is omitted, and the adhesive layer 44 covers and contacts all or part of each side surface of the semiconductor chip 24. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The adhesive layer 44 may be disposed in the cavity 32 positioned at a central portion of the interposer substrate 30 as shown in FIG. 2. The adhesive layer 44 may be disposed on the central portion of the interposer substrate 30 as shown in FIG. 2. The adhesive layer 44 may be disposed in the cavity 32 in the lower surface 30b of the interposer substrate 30.

The interposer adhesive structure IPA1 may include connection bumps 28. The connection bumps 28 may be formed on the interposer substrate 30 around the cavity 32. Each connection bump 28 may be divided into a lower connection bump (28a in FIG. 4) and an upper connection bump (28b in FIG. 4), as will be described later. The interposer adhesive structure IPA1 may include the lower connection bump (28a of FIG. 4) and the upper connection bump (28b of FIG. 4) electrically connected to each other. A material constituting the connection bumps 28 is the same as described above.

The semiconductor package structure PS1 may include the molding layer 46 sealing between the semiconductor chip mounting structure CH1 and the interposer adhesive structure IPA1 as shown in FIGS. 1A and 1B. The molding layer 46 may seal both the semiconductor chip 24 and the adhesive layer 44 between the upper surface 10a of the package substrate 10 and the lower surface of the interposer substrate 30. The molding layer 46 may seal all of the semiconductor chip 24, the underfill layer 26, the connection bump 28, and the adhesive layer 44 positioned on the package substrate 10.

The molding layer 46 may be formed of or may include a thermosetting resin, a thermoplastic resin, a UV curable resin, or a combination thereof. The molding layer 46 may be formed of or may include an epoxy resin, a silicone resin, or a combination thereof. The molding layer 46 may be formed of or may include an epoxy mold compound (EMC).

Figure 4:
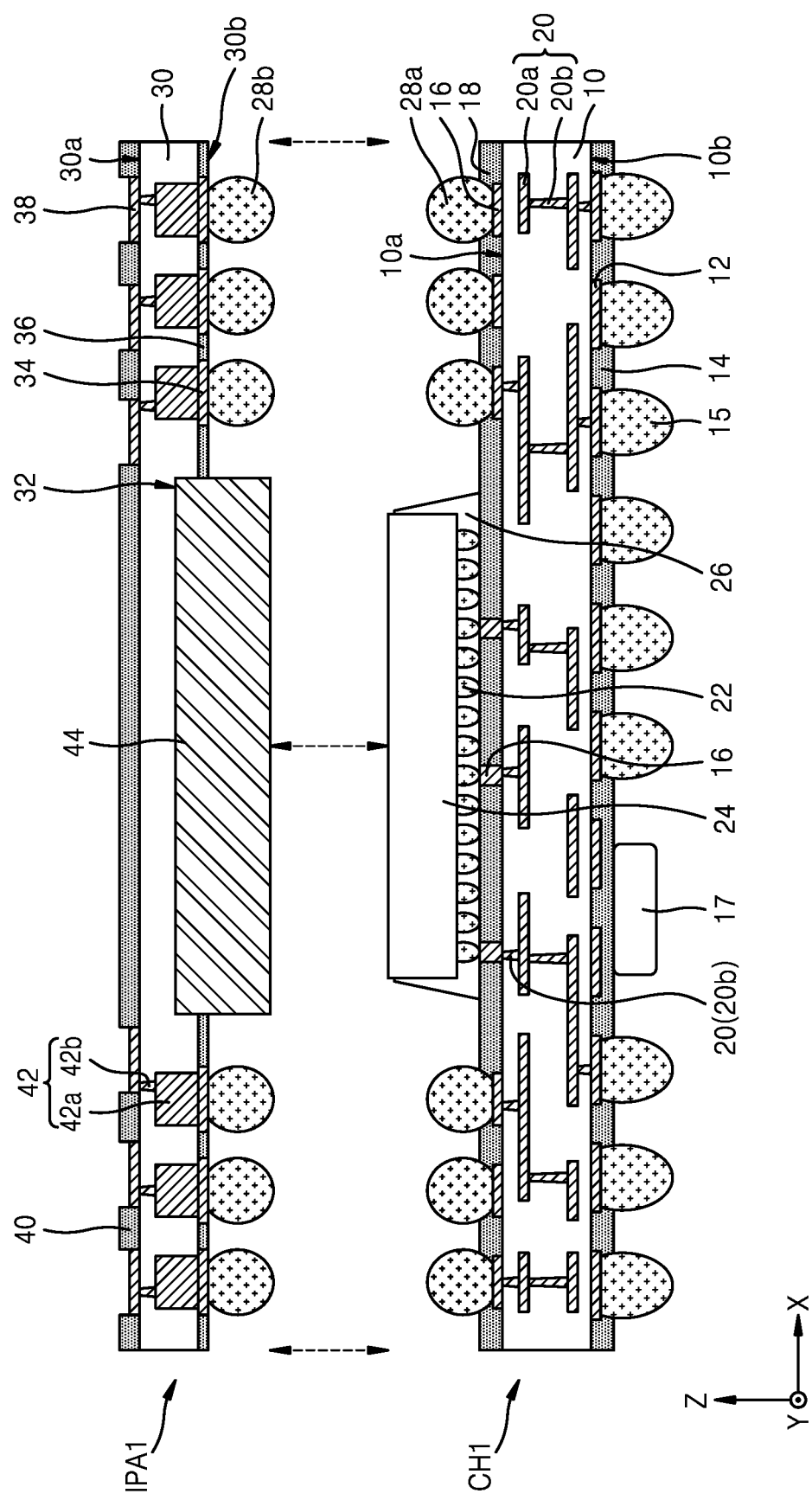
FIG. 4 is an exploded cross-sectional view illustrating a manufacturing process of adhering the interposer adhesive structure of FIGS. 3A and 3B and a semiconductor chip mounting structure of FIGS. 1A and 1B, according to an embodiment of the inventive concept.

FIGS. 3A and 3B are cross-sectional views illustrating the interposer adhesive structure IPA1 of FIGS. 1A and 1B, and FIG. 4 is an exploded cross-sectional view illustrating a manufacturing process of adhering the interposer adhesive structure IPA1 of FIGS. 3A and 3B and the semiconductor chip mounting structure CH1 of FIGS. 1A and 1B.

Specifically, in FIGS. 3A, 3B, and 4, the same reference numerals as those of FIGS. 1A, 1B and 2 denote the same members. In FIGS. 3A, 3B and 4, the same descriptions as those of FIGS. 1A, 1B and 2 are briefly given or omitted. FIG. 3B may be a cross-sectional view taken along line IIIb-IIIb' of FIG. 2.

The interposer adhesive structure IPA1 illustrated in FIG. 3A does not include the adhesive layer 44 for convenience. As described above, the interposer adhesive structure IPA1 may include the interposer substrate 30. The interposer substrate 30 may include the upper surface 30a and the lower surface 30b.

The interposer substrate 30 may have the cavity 32 recessed from the lower surface 30b thereof. The cavity 32 may be of a non-penetrating type (or a non-through type) formed between the lower surface 30b and the upper surface 30a. For example, the cavity 32 may not fully penetrate between the lower surface 30b and the upper surface 30a.

FIG. 3B illustrates adhering the adhesive layer 44 into the cavity 32 of FIG. 3A. The adhesive layer 44 may be below the lower surface 30b of the interposer substrate 30 when filled in the cavity 32. The adhesive layer 44 may use, for example, a semi-curable (B-Stage) thermosetting resin.

Here, the manufacturing process of adhering the interposer adhesive structure IPA1 of FIGS. 3A and 3B and the semiconductor chip mounting structure CH1 of FIGS. 1A and 1B to each other will be described with reference to FIG. 4.

As shown in FIG. 4, the interposer adhesive structure IPA1 of FIGS. 3A and 3B is positioned on the semiconductor chip mounting structure CH1 of FIGS. 1A and 1B. The semiconductor chip mounting structure CH1 and the interposer adhesive structure IPA1 are closely adhered to each other. The lower connection bumps 28a and the semiconductor chip 24 of the semiconductor chip mounting structure CH1 are aligned and adhered to the upper connection bumps 28b and the adhesive layer 44 of the interposer adhesive structure IPA1, respectively, to form connection bumps 28 that each include both the lower connection bump 28a and the upper connection bump 28b.

When the semiconductor chip mounting structure CH1 and the interposer adhesive structure IPA1 are closely adhered, the adhesive layer 44 provided on the interposer adhesive structure IPA1 may be impregnated or infiltrated on the upper surface (24a in FIG. 1B) and both side surfaces (24c and 24d in FIG. 1B) of the semiconductor chip 24 of the semiconductor chip mounting structure CH1. In a plan view, where a square or rectangular semiconductor chip 24 is used, the adhesive layer 44 provided on the interposer adhesive structure IPA1 may be impregnated or infiltrated on all four side surfaces of the semiconductor chip 24. Because the adhesive layer 44 uses a semi-curing (B-Stage) thermosetting resin, the adhesive layer 44 may be easily disposed on the upper surface (24a in FIG. 1B) and the both side surfaces (24c and 24d in FIG. 1B), or all side surfaces, of the semiconductor chip 24.

After the semiconductor chip mounting structure CH1 and the interposer adhesive structure IPA1 are closely adhered, the lower connection bumps 28a and the upper connection bumps 28b may result in manufacturing the connection bumps 28 of FIG. 1A. In addition, after the semiconductor chip mounting structure CH1 and the interposer adhesive structure IPA1 are closely adhered and the adhesive layer 44 is cured, the semiconductor package structure PS1 may be manufactured as shown in FIGS. 1A and 1B.

Subsequently, the molding layer 46 sealing between the semiconductor chip mounting structure CH1 and the interposer adhesive structure IPA1 of the semiconductor package structure PS1 may be formed as shown in FIG. 1A. In some embodiments, the molding layer 46 may not be formed. As can be seen from the above process, in some embodiments, first, a semiconductor chip is formed on a first substrate (e.g., a package substrate, such as package substrate 10), and an adhesive layer is formed on, and in some cases partially in, a second substrate (e.g., an interposer substrate, such as interposer substrate 30), and then second, the two structures are brought together so that the adhesive layer forms on and around the semiconductor chip during a step in which the two substrates are physically and electrically connected to each other.

Figure 5A:
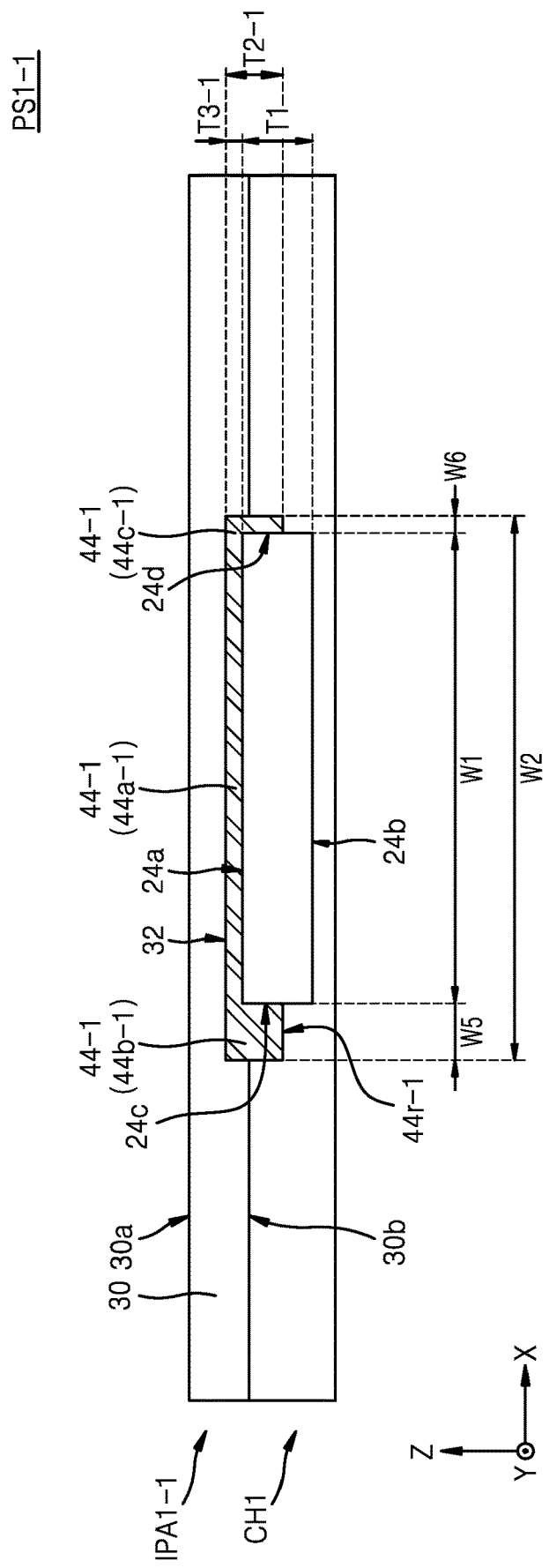
FIG. 5A is a cross-sectional view illustrating some components of a semiconductor package structure according to an embodiment of the inventive concept.

FIG. 5A is a cross-sectional view illustrating some components of a semiconductor package structure PS1-1 according to an embodiment of the inventive concept.

Specifically, the semiconductor package structure PS1-1 of FIG. 5A may be the same as the semiconductor package structure PS1 of FIGS. 1A and 1B except for an arrangement or a shape of an adhesive layer 44-1. In FIG. 5A, the same reference numerals as those in FIGS. 1A and 1B denote the same members. In FIG. 5A, the same descriptions as those of FIGS. 1A and 1B are briefly given or omitted.

The semiconductor package structure PS1-1 may include the semiconductor chip mounting structure CH1 and an interposer adhesive structure IPA1-1. The semiconductor chip 24 included in the semiconductor chip mounting structure CH1 may include the upper surface 24a, the lower surface 24b, and opposite side surfaces 24c and 24d (as well as side surfaces not shown from the X-Z cross-sectional view taken along the X-axis and the Z-axis). The semiconductor chip 24 may have the first width W1 and the first thickness T1.

The interposer adhesive structure IPA1-1 may include the interposer substrate 30 and the adhesive layer 44-1. The interposer substrate 30 includes the upper surface 30a and the lower surface 30b. The interposer substrate 30 may include the cavity 32 corresponding to the semiconductor chip 24. The cavity 32 may have the second width W2.

The adhesive layer 44-1 may have a second thickness T2-1 in the vertical (i.e. Z) direction. The second thickness T2-1 may be less than the second thickness T2 of FIG. 1B. The adhesive layer 44-1 may include an upper adhesive layer 44a-1 formed on the upper surface of the semiconductor chip 24, and a first side adhesive layer 44b-1 and a second side adhesive layer 44c-1 formed on the opposite side surfaces 24c and 24d of the semiconductor chip 24, respectively. Additional side adhesive layers (not shown) may be included to cover the other side surfaces of the semiconductor chip (not shown in the X-Z cross-sectional view taken along the X-axis and the Z-axis). The upper adhesive layer 44a-1 may have a third thickness T3-1 in the vertical (i.e. Z) direction from the upper surface 24a of the semiconductor chip 24. The third thickness T3-1 may be the same as the third thickness T3 of FIG. 1B. A lower surface 44r-1 (e.g., lowermost surface) of the adhesive layer 44-1 formed on the side surfaces of the semiconductor chip 24 may be higher than the lower surface 24b of the semiconductor chip 24.

The first side adhesive layer 44b-1 and the second side adhesive layer 44c-1 have a fifth width W5 and a sixth width W6 respectively extending from the side surfaces 24c and 24d of the semiconductor chip 24. In other words, the adhesive layer 44-1 may have the fifth width W5 from the side surface 24c and the sixth width W6 from the side surface 24d of the semiconductor chip 24. The fifth width W4 and the sixth width W6 may have different values. The fifth width W5 may be greater than the sixth width W6. At least one of the fifth width W5 and the sixth width W6 may be equal to or less than 1 mm. Accordingly, the first side adhesive layer 44b-1 and the second side adhesive layer 44c-1 may have an asymmetric structure with respect to the semiconductor chip 24.

Figure 5B:
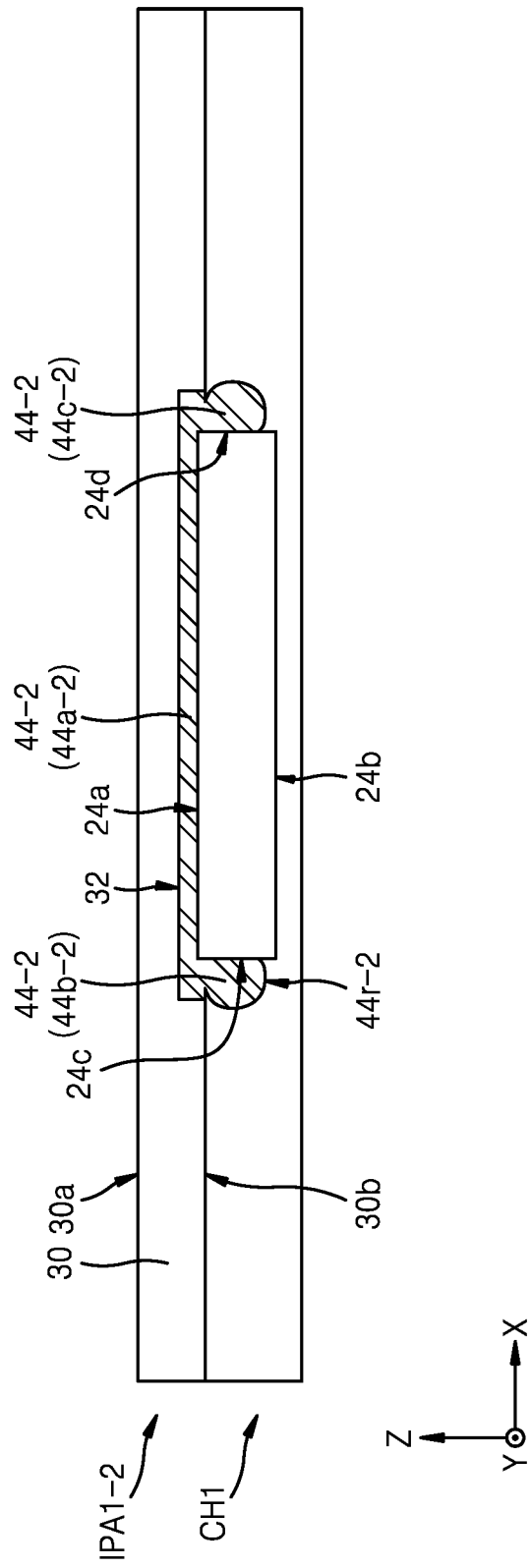
FIG. 5B is a cross-sectional view illustrating some components of a semiconductor package structure according to an embodiment of the inventive concept.

FIG. 5B is a cross-sectional view illustrating some components of a semiconductor package structure PS1-2 according to an embodiment of the inventive concept.

Specifically, the semiconductor package structure PS1-2 of FIG. 5B may be the same as the semiconductor package structure PS1 of FIGS. 1A and 1B except for an arrangement or a shape of an adhesive layer 44-2. In FIG. 5B, the same reference numerals as those in FIGS. 1A and 1B denote the same members. In FIG. 5B, the same descriptions as those of FIGS. 1A and 1B are briefly given or omitted.

The semiconductor package structure PS1-2 may include the semiconductor chip mounting structure CH1 and an interposer adhesive structure IPA1-2. The semiconductor chip 24 included in the semiconductor chip mounting structure CH1 may include the upper surface 24a, the lower surface 24b, and opposite side surfaces 24c and 24d (as well as side surfaces not shown from the X-Z cross-sectional view taken along the X-axis and the Z-axis).

The interposer adhesive structure IPA1-2 may include the interposer substrate 30 and the adhesive layer 44-2. The interposer substrate 30 includes the upper surface 30a and the lower surface 30b. The interposer substrate 30 may include the cavity 32 corresponding to the semiconductor chip 24.

The adhesive layer 44-2 may include an upper adhesive layer 44a-2 formed on the upper surface of the semiconductor chip 24, and a first side adhesive layer 44b-2 and a second side adhesive layer 44c-2 formed on the side surfaces 24c and 24d of the semiconductor chip 24, respectively.

A lower surface 44r-2 of the first side adhesive layer 44b-2 and the second side adhesive layer 44c-2 may have an elliptical shape. In other words, the lower surface 44r-2 of the adhesive layer 44-2 formed on both side surfaces 24c and 24d of the semiconductor chip 24 may have the elliptical shape. The first side adhesive layer 44b-2 and the second side adhesive layer 44c-2 may have a symmetrical structure with respect to the semiconductor chip 24. In the above embodiments, as well as the embodiments described below, the adhesive layer (e.g., 44, 44-1, 44-2, etc.) may have a plurality of portions. A first portion may be formed on a top surface of the semiconductor chip 24, and may be described as an upper adhesive layer. Additional portions may be formed on each side surface of the semiconductor chip 24, and may be described, for example, as first through fourth side adhesive layers. The first through fourth side adhesive layers may be continuously formed among themselves and also with the upper adhesive layer, and together may be referred to as a lower adhesive layer (in contrast to the upper adhesive layer formed thereabove) or a (singular) side adhesive layer (since it may continuously surround all sides of the semiconductor chip 24).

Figure 6A:
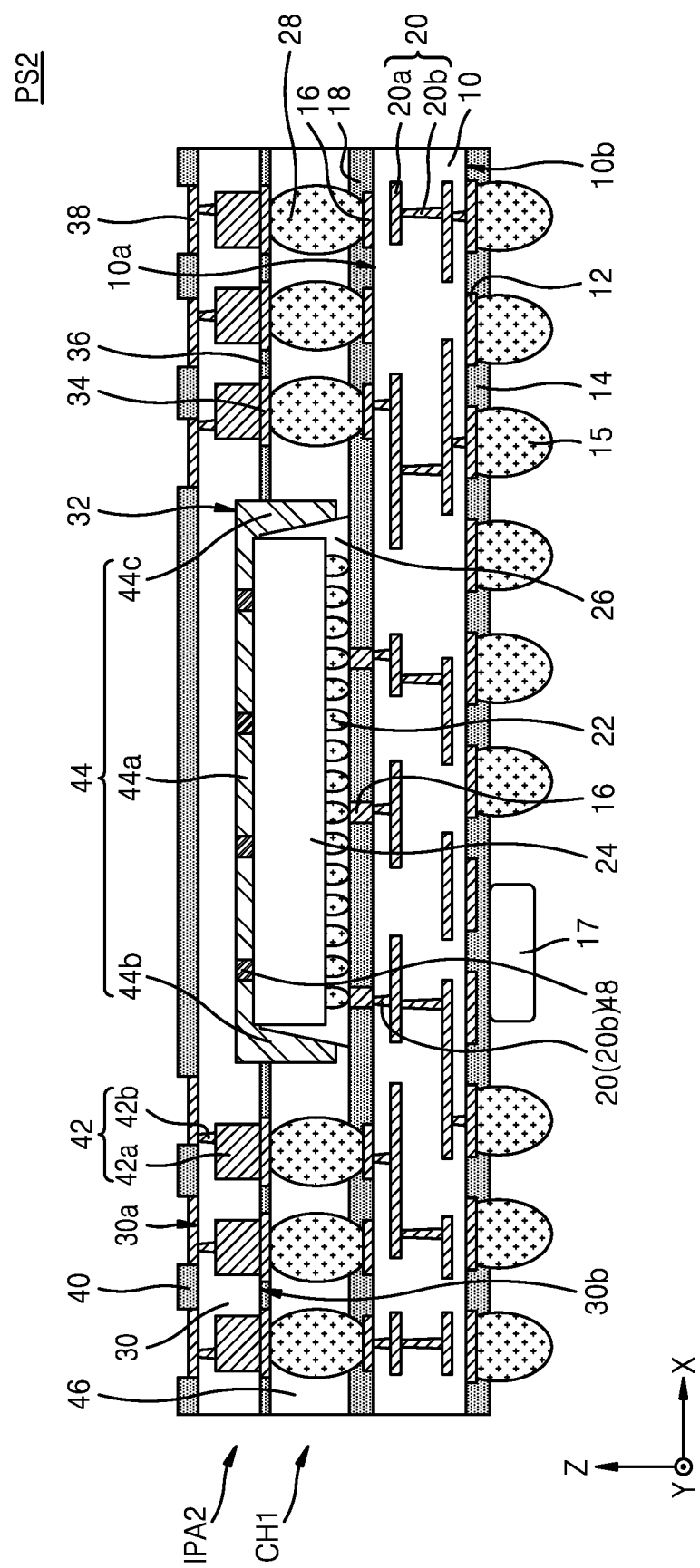
FIG. 6A is a cross-sectional view illustrating a semiconductor package structure according to an embodiment of the inventive concept.
Figure 6B:
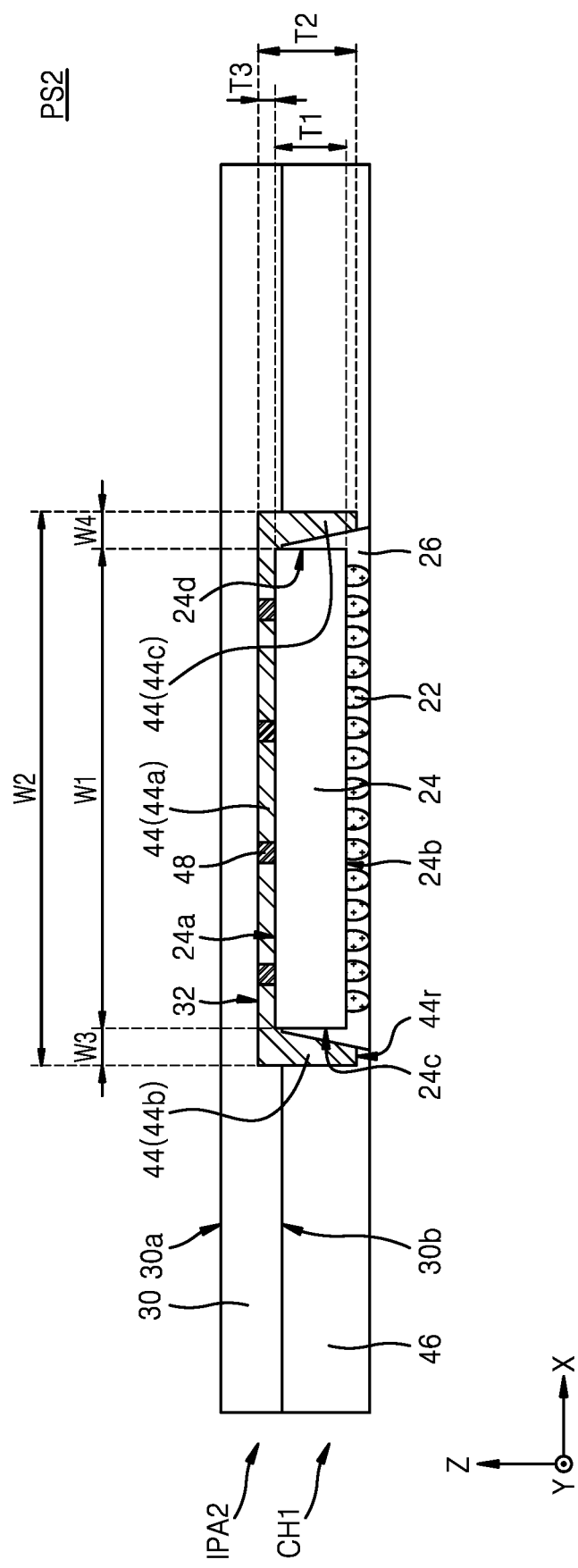
FIG. 6B is a cross-sectional view illustrating some components of FIG. 6A, according to an embodiment of the inventive concept.

FIG. 6A is a cross-sectional view illustrating a semiconductor package structure PS2 according to an embodiment of the inventive concept, FIG. 6B is a cross-sectional view illustrating some components of FIG. 6A, and FIG. 7 is a layout diagram illustrating an arrangement of the interposer substrate 30, the adhesive layer 44, and patch patterns 48 of FIG. 6A.

Specifically, the semiconductor package structure PS2 of FIGS. 6A, 6B and 7 may be the same as the semiconductor package structure PS1 of FIGS. 1A, 1B and 2 except that the semiconductor package structure PS2 further includes the plurality of patch patterns 48.

In FIGS. 6A, 6B and 7, the same reference numerals as those in FIGS. 1A, 1B and 2 denote the same members. In FIGS. 6A, 6B and 7, the same descriptions as those of FIGS. 1A, 1B and 2 are briefly given or omitted.

The semiconductor package structure PS2 may include the semiconductor chip mounting structure CH1, an interposer adhesive structure IPA2 attached on the semiconductor chip mounting structure CH1, and the molding layer 46 sealing between the semiconductor chip mounting structure CH1 and the interposer adhesive structures IPA2 as shown in FIG. 6A. The semiconductor chip mounting structure CH1 has been described with reference to FIGS. 1A, 1B and 2, and thus a detailed description thereof will be omitted.

The interposer adhesive structure IPA2 may include the interposer substrate 30, the adhesive layer 44, and the plurality of patch patterns 48. The interposer substrate 30 may include the cavity 32 recessed inward from the lower surface 30b to correspond to the semiconductor chip 24 as shown in FIGS. 6A and 6B. The semiconductor chip 24 may include the upper surface 24a, the lower surface 24b, and the opposite side surfaces 24c and 24d as shown in FIG. 6B.

The adhesive layer 44 may be positioned inside and outside the cavity 32, and also formed on the upper surface 24a and both side surfaces 24c and 24d of the semiconductor chip 24 as shown in FIGS. 6A and 6B. The adhesive layer 44 may include an upper adhesive layer 44a formed on the upper surface of the semiconductor chip 24, and a first side adhesive layer 44b and a second side adhesive layer 44c formed on opposite side surfaces 24c and 24d of the semiconductor chip 24, respectively (as well as side surfaces not shown in the X-Z cross-sectional view taken along the X-axis and the Z-axis).

The adhesive layer 44 may be disposed in the cavity 32 positioned at a central portion of the interposer substrate 30 as shown in FIG. 7. The adhesive layer 44 may be disposed in the cavity 32 positioned on the lower surface 30b of the interposer substrate 30.

The patch patterns 48 are positioned apart from each other inside the adhesive layer 44(44a) formed on the upper surface 24a of the semiconductor chip 24 and on the cavity 32 as shown in FIGS. 6A and 6B. The patch patterns 48 may be positioned in the adhesive layer 44 positioned at the central portion of the interposer substrate 30 as shown in FIG. 7. The patch patterns 48 may be formed of or may include, for example, solder resist patterns.

The patch patterns 48 may have the same vertical thickness the same as the third thickness T3 of the upper adhesive layer 44a. When the patch patterns 48 are further included in the upper adhesive layer 44a, a void may not be generated in the upper adhesive layer 44a, and the bonding reliability between the semiconductor chip 24 and the interposer substrate 30 may be further improved.

Figure 8A:
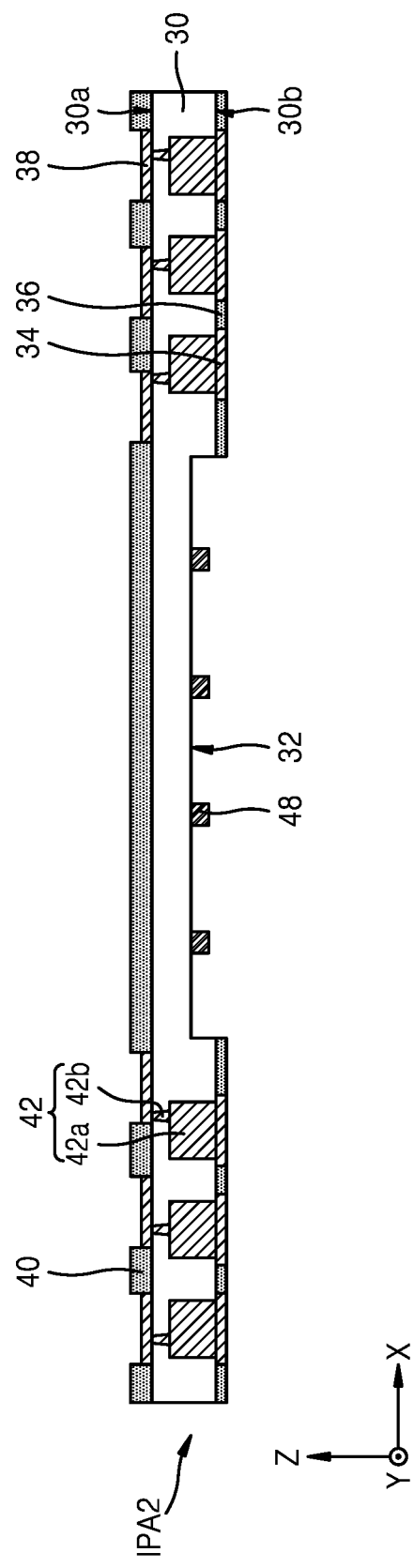
FIGS. 8A and 8B are cross-sectional views illustrating an interposer adhesive structure of FIGS. 6A and 6B, according to an embodiment of the inventive concept.
Figure 8B:
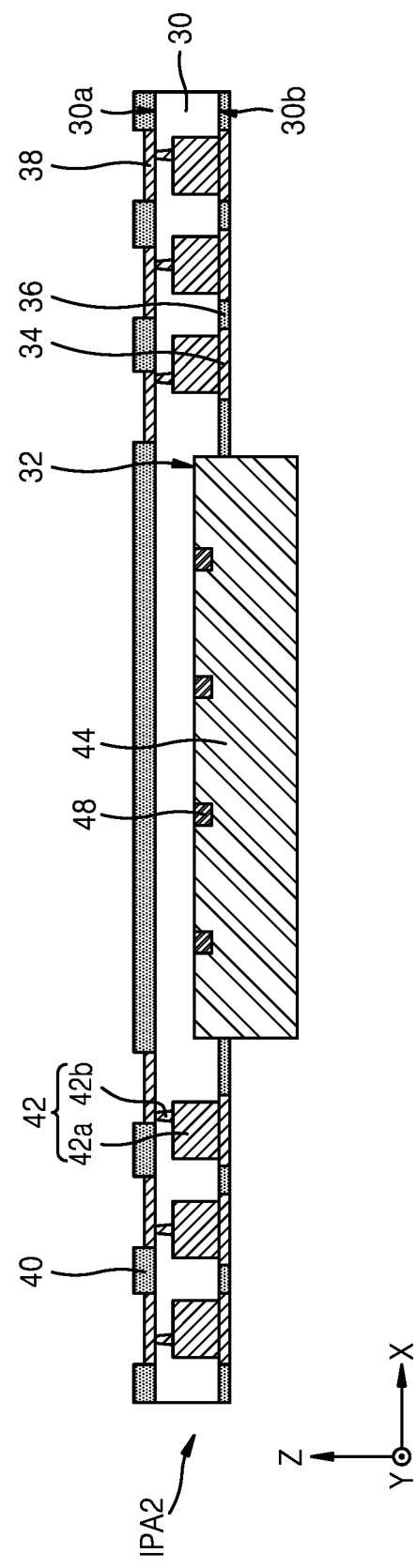
Figure 9:
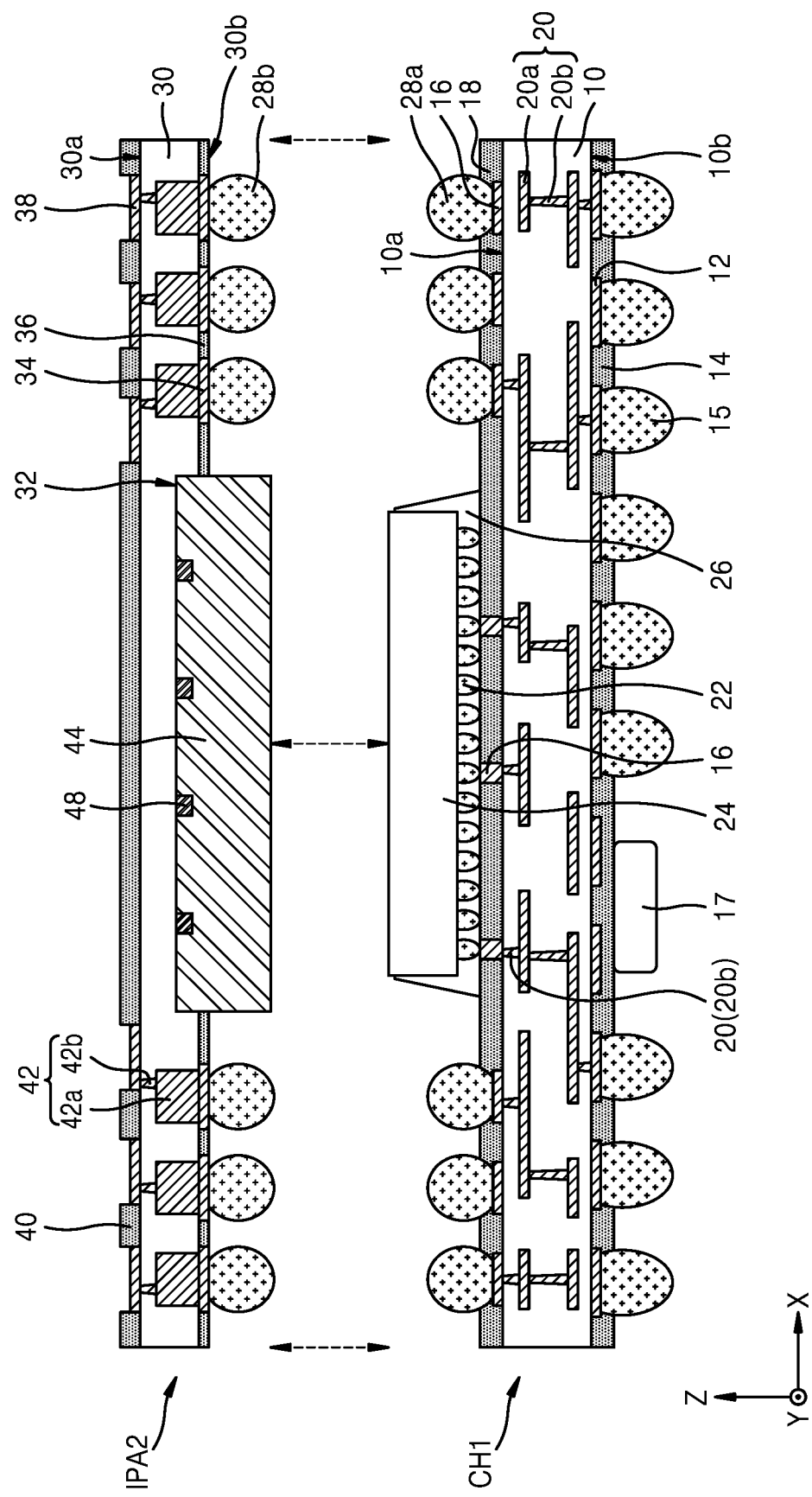
FIG. 9 is an exploded cross-sectional view illustrating a manufacturing process of adhering the interposer adhesive structure of FIGS. 8A and 8B and a semiconductor chip mounting structure of FIGS. 6A and 6B, according to an embodiment of the inventive concept.

FIGS. 8A and 8B are cross-sectional views illustrating the interposer adhesive structure IPA2 of FIGS. 6A and 6B, and FIG. 9 is an exploded cross-sectional view illustrating a manufacturing process of adhering the interposer adhesive structure IPA2 of FIGS. 8A and 8B and the semiconductor chip mounting structure CH1 of FIGS. 6A and 6B.

Specifically, in FIGS. 8A, 8B and 9, the same reference numerals as those of FIGS. 6A, 6B and 7 indicate the same members. In FIGS. 8A, 8B, and 9, the same descriptions as those of FIGS. 6A, 6B, and 7 are briefly given or omitted. FIG. 8B may be a cross-sectional view taken along line VIIIb-VIIIb' of FIG. 7.

The interposer adhesive structure IPA2 illustrated in FIG. 8A does not include the adhesive layer 44 for convenience. As described above, the interposer adhesive structure IPA2 may include the interposer substrate 30. The interposer substrate 30 may include the upper surface 30a and the lower surface 30b.

The cavity 32 recessed from the lower surface 30b may be formed in the interposer substrate 30. The cavity 32 may be of a non-penetrating type formed between the lower surface 30b and the upper surface 30a. In other words, the cavity 32 may not penetrate between the lower surface 30b and the upper surface 30a.

FIG. 8B shows forming the patch patterns 48 in the cavity 32 of FIG. 8A and then adhering the adhesive layer 44 to the cavity 32 in which the patch patterns 48 are formed. The adhesive layer 44 may be below the lower surface 30b of the interposer substrate 30 when filled in the cavity 32. The adhesive layer 44 may use a semi-curable (B-Stage) thermosetting resin.

Here, the manufacturing process of adhering the interposer adhesive structure IPA2 of FIGS. 8A and 8B and the semiconductor chip mounting structure CH1 of FIGS. 6A and 6B to each other will be described with reference to FIG. 9.

As shown in FIG. 9, the interposer adhesive structure IPA2 of FIGS. 8A and 8B is positioned on the semiconductor chip mounting structure CH1 of FIGS. 6A and 6B. The semiconductor chip mounting structure CH1 and the interposer adhesive structure IPA2 are closely adhered to each other. The lower connection bump 28a and the semiconductor chip 24 of the semiconductor chip mounting structure CH1 are aligned and adhered to the upper connection bump 28b and the adhesive layer 44 including the patch patterns 48 of the interposer adhesive structure IPA2, respectively.

When the semiconductor chip mounting structure CH1 and the interposer adhesive structure IPA2 are closely adhered, the adhesive layer 44 provided on the interposer adhesive structure IPA2 may be impregnated or infiltrated on the upper surface (24a in FIG. 6b) and both side surfaces (24c and 24d in FIG. 6b) of the semiconductor chip 24 of the semiconductor chip mounting structure CH1.

Because the adhesive layer 44 uses a semi-curing (B-Stage) thermosetting resin, the adhesive layer 44 may be easily disposed on the upper surface (24a in FIG. 6b) and the both side surfaces (24c and 24d in FIG. 6b) of the semiconductor chip 24.

In addition, when the semiconductor chip mounting structure CH1 and the interposer adhesive structure IPA2 are closely adhered, a distance between the upper surface (24a in FIG. 6B) and the cavity 32 of the semiconductor chip 24 may be easily adjusted due to the patch patterns 48.

After the semiconductor chip mounting structure CH1 and the interposer adhesive structure IPA2 are closely adhered, the lower connection bump 28a and the upper connection bump 28b may result in manufacturing the connection bump 28 of FIG. 6A. In addition, after the semiconductor chip mounting structure CH1 and the interposer adhesive structure IPA1 are closely adhered and the adhesive layer 44 is cured, the semiconductor package structure PS2 may be manufactured as shown in FIGS. 6A and 6B.

Subsequently, the molding layer 46 sealing between the semiconductor chip mounting structure CH1 and the interposer adhesive structure IPA2 of the semiconductor package structure PS2 may be formed as shown in FIG. 6A. In some embodiments, the molding layer 46 may not be formed.

Figure 10A:
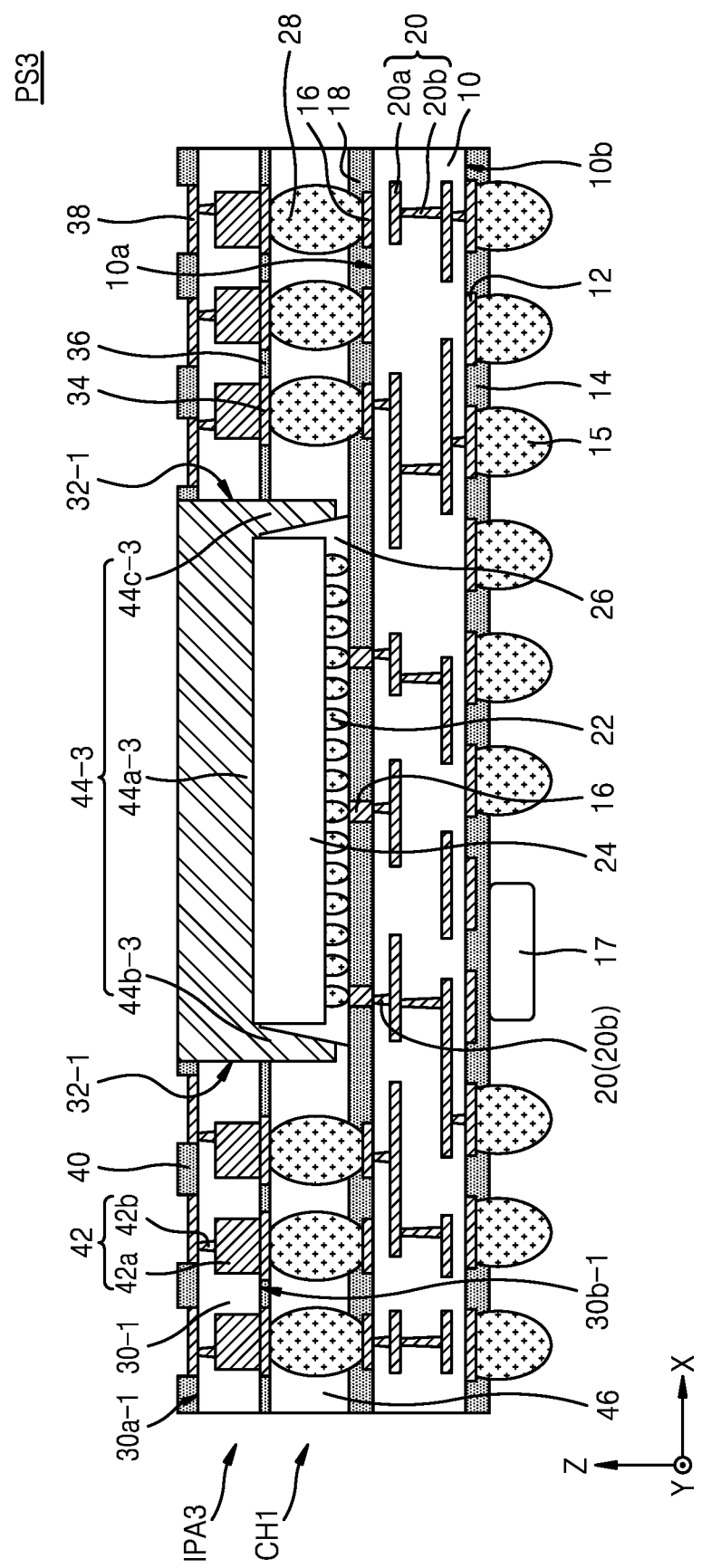
FIG. 10A is a cross-sectional view illustrating a semiconductor package structure according to an embodiment of the inventive concept.
Figure 10B:
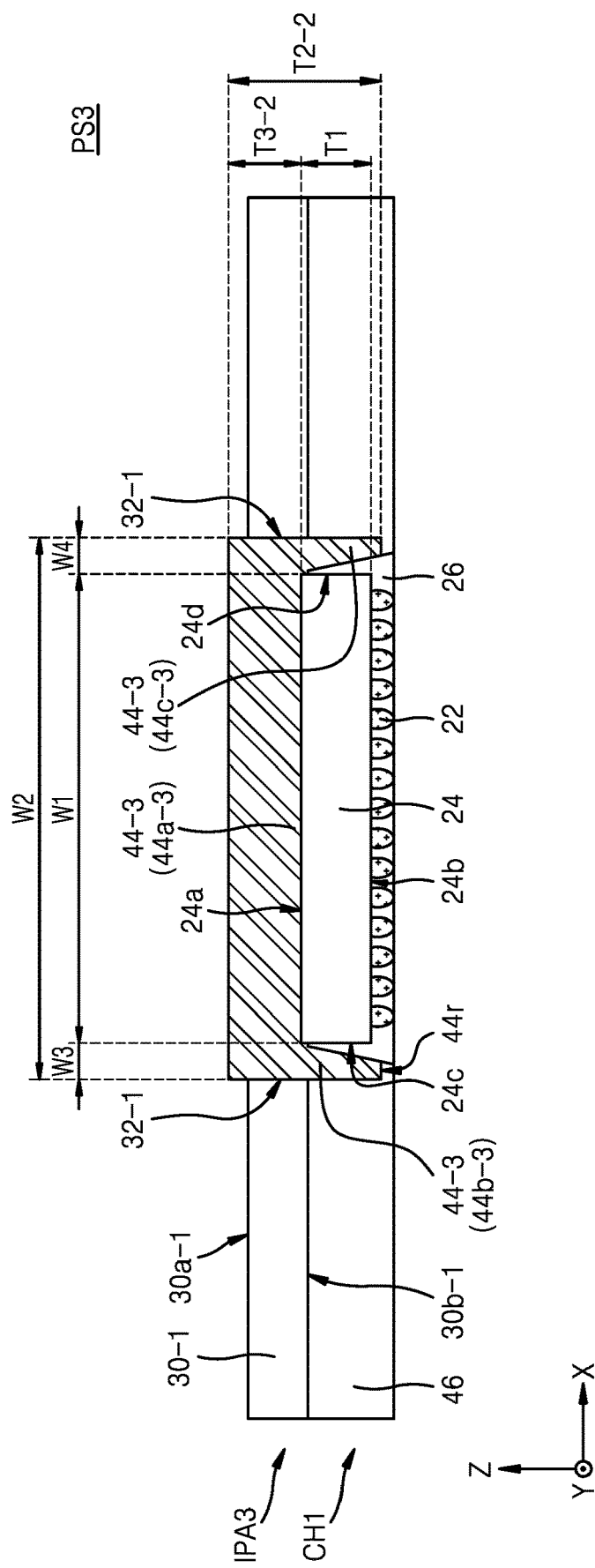
FIG. 10B is a cross-sectional view illustrating some components of FIG. 10A, according to an embodiment of the inventive concept.
Figure 11:
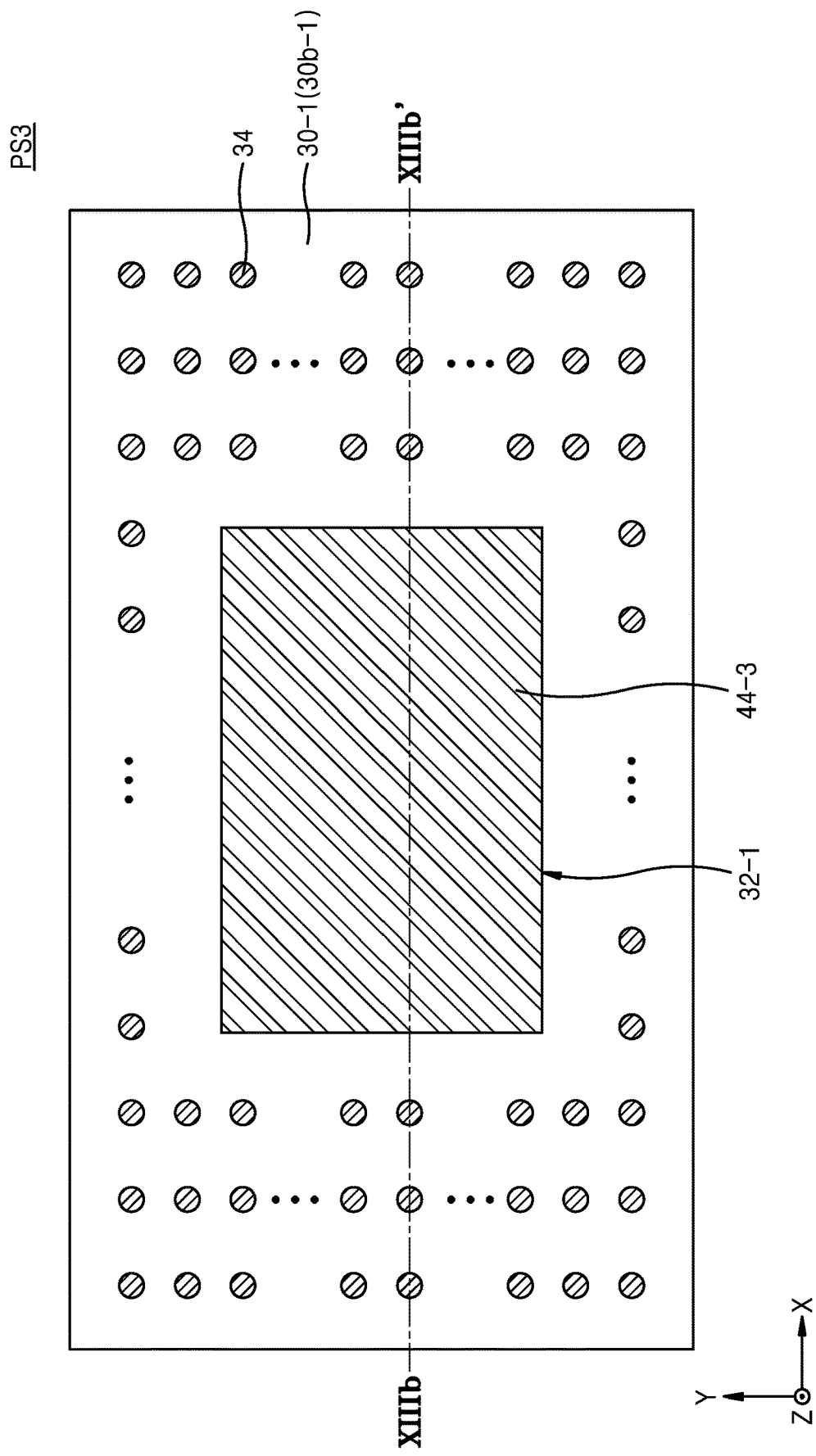
FIG. 11 is a layout diagram illustrating an arrangement of an interposer substrate, a penetration-type cavity, and an adhesive layer of FIG. 10A, according to an embodiment of the inventive concept.

FIG. 10A is a cross-sectional view illustrating a semiconductor package structure PS3 according to an embodiment of the inventive concept, FIG. 10B is a cross-sectional view illustrating some components of FIG. 10A, and FIG. 11 is a layout diagram illustrating an arrangement of an interposer substrate 30-1, a penetration-type (or a through type) cavity 32-1 and an adhesive layer 44-3 of FIG. 10A.

Specifically, the semiconductor package structure PS3 of FIGS. 10A, 10B and 11 may be the same as the semiconductor package structure PS1 of FIGS. 1A, 1B and 2 except that the semiconductor package structure PS3 includes the penetration-type cavity 32-1.

In FIGS. 10A, 10B and 11, the same reference numerals as those in FIGS. 1A, 1B and 2 denote the same members. In FIGS. 10A, 10B, and 11, the same descriptions as those of FIGS. 1A, 1B and 2 are briefly given or omitted.

The semiconductor package structure PS3 may include the semiconductor chip mounting structure CH1, an interposer adhesive structure IPA3 attached on the semiconductor chip mounting structure CH1, and the molding layer 46 sealing between the semiconductor chip mounting structure CH1 and the interposer adhesive structures IPA3 as shown in FIG. 10A. The semiconductor chip mounting structure CH1 has been described with reference to FIGS. 1A, 1B and 2, and thus a detailed description thereof will be omitted.

The interposer adhesive structure IPA3 may include the interposer substrate 30-1 including the penetration-type cavity 32-1 and the adhesive layer 44-3. The interposer substrate 30-1 may include the penetration-type cavity 32-1 fully penetrating from a lower surface 30b-1 to an upper surface 30a-1 and corresponding to the semiconductor chip 24 as shown in FIGS. 10A and 10B. In this case, the cavity 32-1 is recessed all the way through the interposer substrate 30-1 from the lower surface 30b-1 of the interposer substrate 30-1. The semiconductor chip 24 may include the upper surface 24a, the lower surface 24b, and both side surfaces 24c and 24d as shown in FIG. 10B (as well as side surfaces not shown in the X-Z cross-sectional view taken along the X-axis and the Z-axis).

The adhesive layer 44-3 may be positioned inside and outside the penetration-type cavity 32-1, and also formed on the upper surface 24a and both side surfaces 24c and 24d of the semiconductor chip 24 as shown in FIGS. 10A and 10B. The adhesive layer 44-3 may include an upper adhesive layer 44a-3 formed on the upper surface of the semiconductor chip 24, and a first side adhesive layer 44b-3 and a second side adhesive layer 44c-3 formed on the side surfaces 24c and 24d of the semiconductor chip 24, respectively.

The adhesive layer 44-3 may be disposed in the penetration-type cavity 32-1 positioned at a central portion of the interposer substrate 30-1 as shown in FIG. 11. The adhesive layer 44-3 may be disposed in the penetration-type cavity 32-1 positioned on the lower surface 30b-1 of the interposer substrate 30-1.

The adhesive layer 44 may have a second thickness T2-2. The upper adhesive layer 44a-3 may have a third thickness T3-2. The upper adhesive layer 44a-3 may have a third thickness T3-2 from the upper surface 24a of the semiconductor chip 24. The third thickness T3-2 of the upper adhesive layer 44a-3 may be greater than the third thickness T3 of the upper adhesive layer 44a of FIG. 1B. In this case, a void may not be generated in the upper adhesive layer 44a-3, and a bonding reliability between the semiconductor chip 24 and the interposer substrate 30-1 may be further improved.

Figure 13:
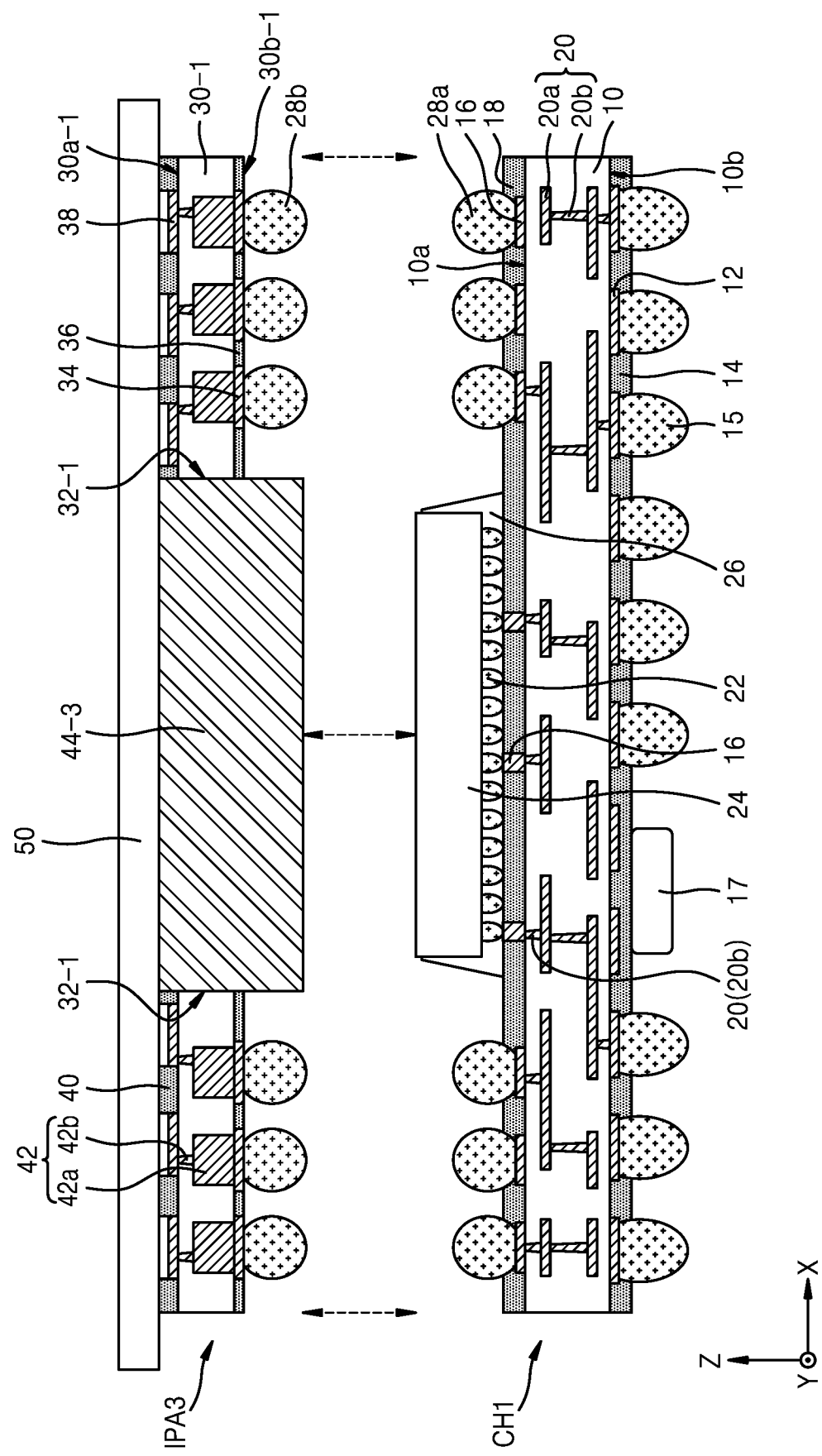
FIG. 13 is an exploded cross-sectional view illustrating a manufacturing process of adhering the interposer adhesive structure of FIGS. 12A and 12B and a semiconductor chip mounting structure of FIGS. 10A and 10B, according to an embodiment of the inventive concept.

FIGS. 12A and 12B are cross-sectional views illustrating the interposer adhesive structure IPA3 of FIGS. 10A and 10B, and FIG. 13 is an exploded cross-sectional view illustrating a manufacturing process of adhering the interposer adhesive structure IPA3 of FIGS. 10A and 10B and the semiconductor chip mounting structure CH1 of FIGS. 12A and 12B.

Specifically, in FIGS. 12A, 12B and 13, the same reference numerals as those of FIGS. 10A, 10B and 11 indicate the same members. In FIGS. 12A, 12B and 13, the same descriptions as those of FIGS. 10A, 10B and 11 are briefly given or omitted. FIG. 12B may be a cross-sectional view taken along line XIIIb-XIIIb' of FIG. 11.

The interposer adhesive structure IPA3 shown in FIG. 12A does not include the adhesive layer 44-3 for convenience. As described above, the interposer adhesive structure IPA3 may include the interposer substrate 30-1 having the penetration-type cavity 32-1. The interposer substrate 30-1 may include the upper surface 30a-1 and the lower surface 30b-1. The penetration-type cavity 32-1 fully penetrating from the lower surface 30b-1 to the upper surface 30a-1 may be formed in the interposer substrate 30-1. The penetration-type cavity 32-1 may penetrate between the lower surface 30b-1 and the upper surface 30a-1.

FIG. 12B illustrates adhering the adhesive layer 44-3 into the penetration-type cavity 32-1 of FIG. 12A. The adhesive layer 44-3 may be below the lower surface 30b-1 of the interposer substrate 30-1 when filled in the penetration-type cavity 32-1. The adhesive layer 44-3 may use a semi-curable (B-Stage) thermosetting resin.

Here, the manufacturing process of adhering the interposer adhesive structure IPA3 of FIGS. 12A and 12B and the semiconductor chip mounting structure CH1 of FIGS. 10A and 10B to each other will be described with reference to FIG. 13.

As shown in FIG. 13, the interposer adhesive structure IPA3 of FIGS. 12A and 12B is positioned on the semiconductor chip mounting structure CH1 of FIGS. 10A and 10B. The interposer adhesive structure IPA3 may be attached to a film substrate 50. The film substrate 50 may be attached to the interposer upper protective layer 40, the interposer upper connection pad 38 and the adhesive layer 44-3 on the upper surface 30a-1 of the interposer substrate 30-1.

The semiconductor chip mounting structure CH1 and the interposer adhesive structure IPA3 attached to the film substrate 50 are closely adhered to each other. The lower connection bump 28a and the semiconductor chip 24 of the semiconductor chip mounting structure CH1 are aligned and adhered to the upper connection bump 28b and the adhesive layer 44-3 of the interposer adhesive structure IPA3, respectively.

When the semiconductor chip mounting structure CH1 and the interposer adhesive structure IPA3 attached to the film substrate 50 are closely adhered, the adhesive layer 44-3 provided on the interposer adhesive structure IPA3 may be impregnated or infiltrated on the upper surface (24a in FIG. 10b) and both side surfaces (24c and 24d in FIG. 10b) of the semiconductor chip 24 of the semiconductor chip mounting structure CH1.

Because the adhesive layer 44-3 uses a semi-curing (B-Stage) thermosetting resin, the adhesive layer 44-3 may be easily disposed on the upper surface (24a in FIG. 10b) and both side surfaces (24c and 24d in FIG. 10b) of the semiconductor chip 24 (as well as the other side surfaces of the semiconductor chip 24).

In addition, when the semiconductor chip mounting structure CH1 and the interposer adhesive structure IPA3 attached to the film substrate 50 are closely adhered, due to the adhesive layer 44-3 included in the penetration-type cavity 32-1, the adhesive layer 44-3 of a great thickness may be positioned on the upper surface (24a in FIG. 10B) of the semiconductor chip 24.

After the semiconductor chip mounting structure CH1 and the interposer adhesive structure IPA3 are closely adhered, the lower connection bump 28a and the upper connection bump 28b may result in manufacturing the connection bump 28 of FIG. 10A. In addition, after the semiconductor chip mounting structure CH1 and the interposer adhesive structure IPA3 are closely adhered and the adhesive layer 44 is cured, the semiconductor package structure PS3 may be manufactured as shown in FIGS. 10A and 10B.

Subsequently, after removing the film substrate 50, the molding layer 46 sealing between the semiconductor chip mounting structure CH1 and the interposer adhesive structure IPA3 of the semiconductor package structure PS3 may be formed as shown in FIG. 10A. In some embodiments, the molding layer 46 may not be formed.

Figure 14A:
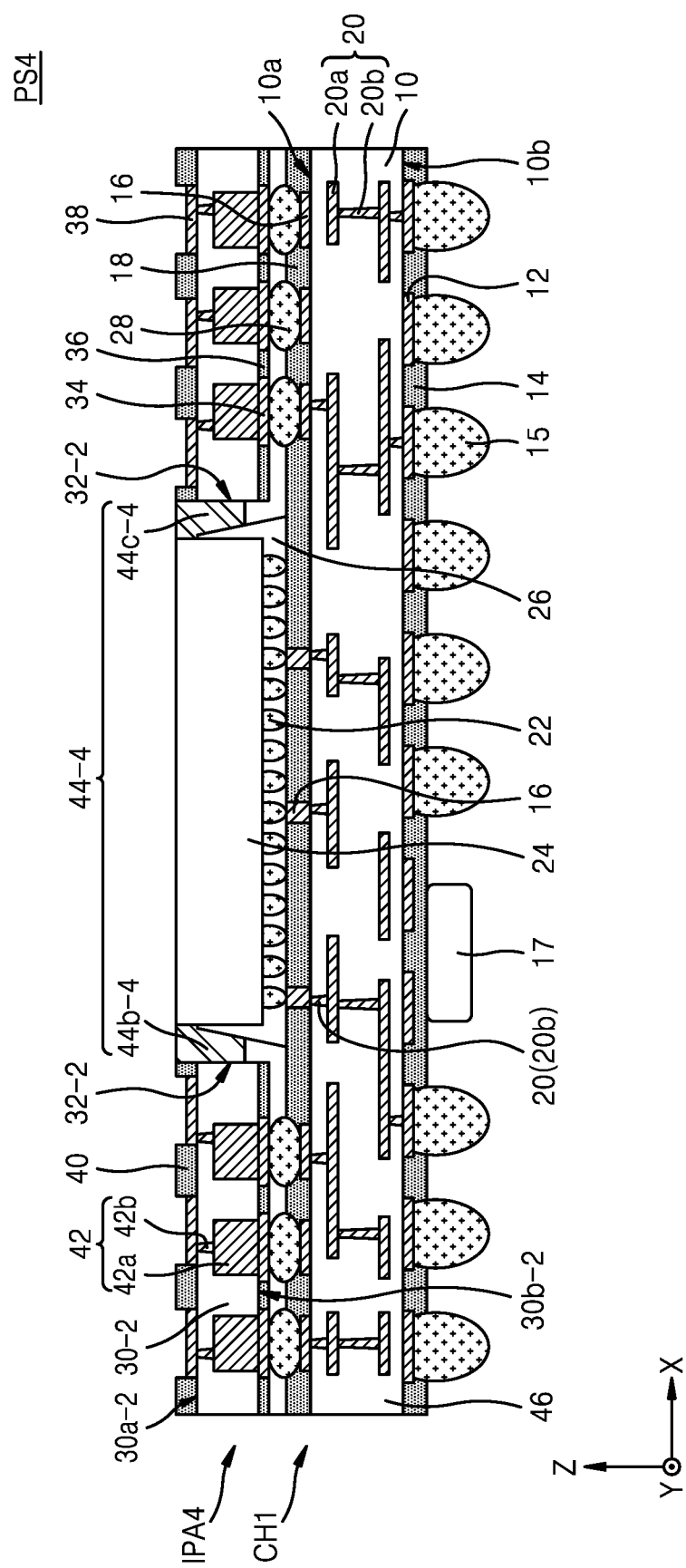
FIG. 14A is a cross-sectional view illustrating a semiconductor package structure according to an embodiment of the inventive concept.
Figure 14B:
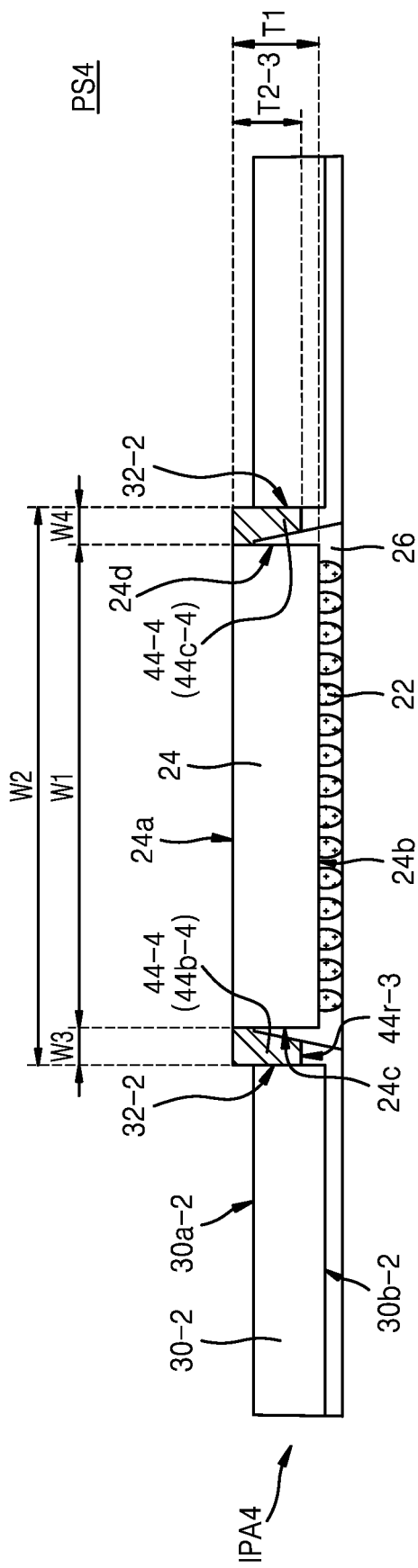
FIG. 14B is a cross-sectional view illustrating some components of FIG. 14A, according to an embodiment of the inventive concept.
Figure 15:
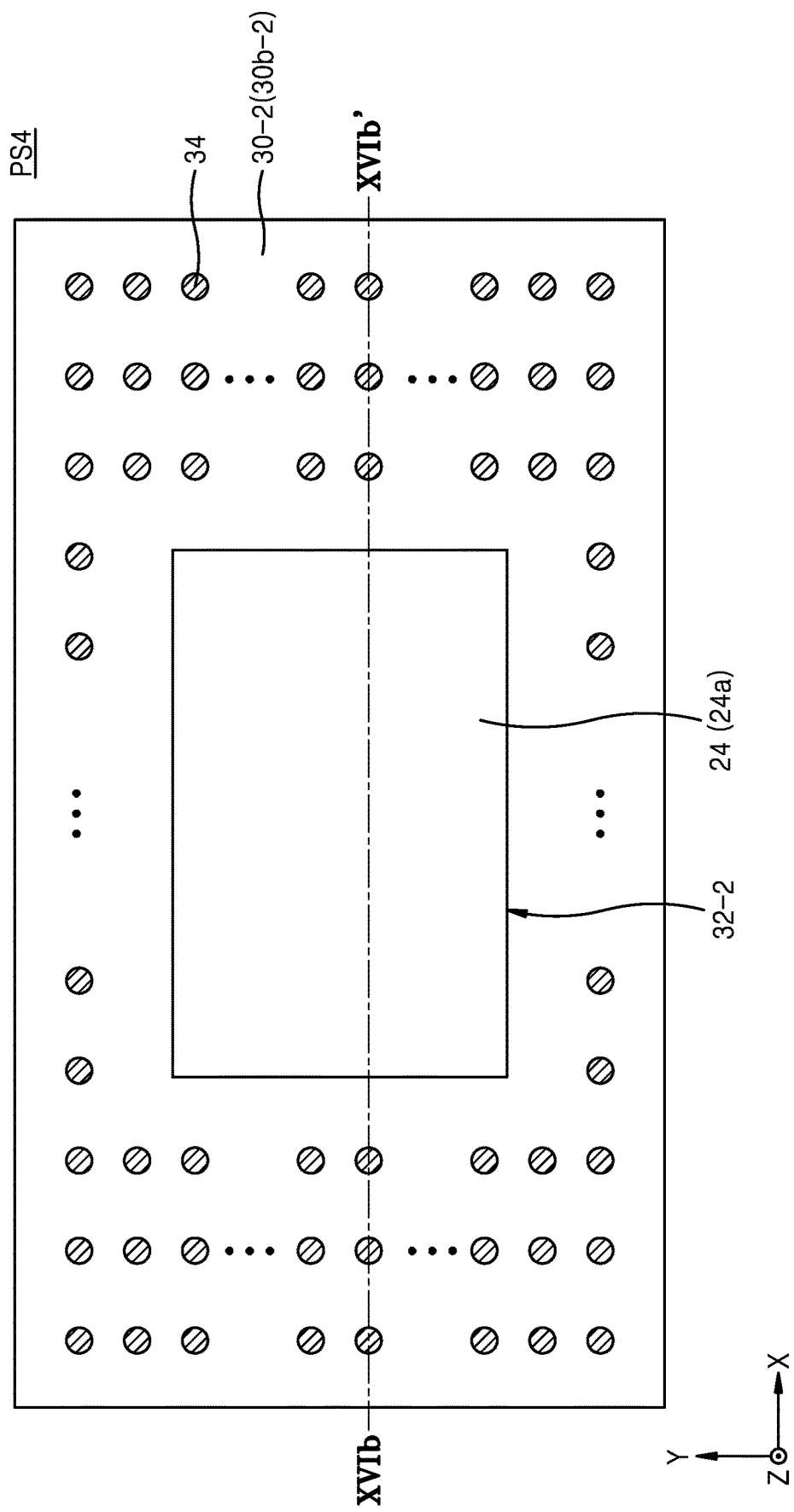
FIG. 15 is a layout diagram illustrating an arrangement of an interposer substrate, a penetration-type cavity, and an adhesive layer of FIG. 14A, according to an embodiment of the inventive concept.

FIG. 14A is a cross-sectional view illustrating a semiconductor package structure PS4 according to an embodiment of the inventive concept, FIG. 14B is a cross-sectional view illustrating some components of FIG. 14A, and FIG. 15 is a layout diagram illustrating an arrangement of an interposer substrate 30-2, a penetration-type cavity 32-2, and an adhesive layer 44-4 of FIG. 14A.

Specifically, the semiconductor package structure PS4 of FIGS. 14A, 14B, and 15 may be the same as the semiconductor package structure PS3 of FIGS. 10A, 10B and 11 except that the semiconductor package structure PS4 includes the penetration-type cavity 32-2 and the upper surface 24a of the semiconductor chip 24 is exposed. In FIGS. 14A, 14B and 15, the same reference numerals as those in FIGS. 10A, 10B and 11 denote the same members. In FIGS. 14A, 14B and 15, the same descriptions as those of FIGS. 10A, 10B and 11 are briefly given or omitted.

The semiconductor package structure PS4 may include the semiconductor chip mounting structure CH1, an interposer adhesive structure IPA4 attached on the semiconductor chip mounting structure CH1, and the molding layer 46 sealing between the semiconductor chip mounting structure CH1 and the interposer adhesive structures IPA4 as shown in FIG. 14A. The semiconductor chip mounting structure CH1 has been described with reference to FIGS. 1A, 1B and 2, and thus a detailed description thereof will be omitted.

The interposer adhesive structure IPA4 may include the interposer substrate 30-2 including the penetration-type cavity 32-2 and the adhesive layer 44-4. The interposer substrate 30-2 may include the penetration-type cavity 32-2 fully penetrating from a lower surface 30b-2 to an upper surface 30a-2 and corresponding to the semiconductor chip 24 as shown in FIGS. 14A and 14B. The semiconductor chip 24 may include the upper surface 24a, the lower surface 24b, and both side surfaces 24c and 24d as shown in FIG. 14B (as well as additional side surfaces not shown).

The adhesive layer 44-4 may be positioned inside and outside the penetration-type cavity 32-2, and also formed on the side surfaces 24c and 24d (and other side surfaces) of the semiconductor chip 24 as shown in FIGS. 14A and 14B. The adhesive layer 44-4 may be formed to expose the upper surface 24a of the semiconductor chip 24. The adhesive layer 44-4 may include a first side adhesive layer 44b-4 and a second side adhesive layer 44c-4 respectively formed on the side surfaces 24c and 24d of the semiconductor chip 24.

A lower surface 44r-3 (e.g., lowermost surface) of the adhesive layer 44-4 formed on the both side surfaces 24c and 24d of the semiconductor chip 24 may be higher than the lower surface 24b (e.g., bottom surface) of the semiconductor chip 24. In other words, the lower surface 44r-3 of the first and second side adhesive layers 44b-4 and 44c-4 formed on the side surfaces 24c and 24d of the semiconductor chip 24 may be higher than the lower surface 24b of the semiconductor chip 24.

In some embodiments, as described above, the lower surface 44r-3 of the first and second side adhesive layers 44b-4 and 44c-4 formed on the side surfaces 24c and 24d of the semiconductor chip 24 may be lower than the lower surface 24b of the semiconductor chip 24.

The penetration-type cavity 32-2 may be disposed in a central portion of the interposer substrate 30 as shown in FIG. 15. The adhesive layer 44-4 may not be disposed to fill the entire area of the penetration-type cavity 32-2 from a plan view, and the upper surface 24a of the semiconductor chip 24 may be positioned therein.

The adhesive layer 44-4 may have a second thickness T2-3. Each of the first side adhesive layer 44b-4 and the second side adhesive layer 44c-4 may have the second thickness T2-3. The second thickness T2-3 of the adhesive layer 44-4 may be less than the first thickness T1 of the semiconductor chip 24. In this case, a void may not be generated in the adhesive layer 44-4, and a bonding reliability between the semiconductor chip 24 and the interposer substrate 30-2 may be improved, and the total thickness of the semiconductor package structure PS4 may be reduced.

Figure 17:
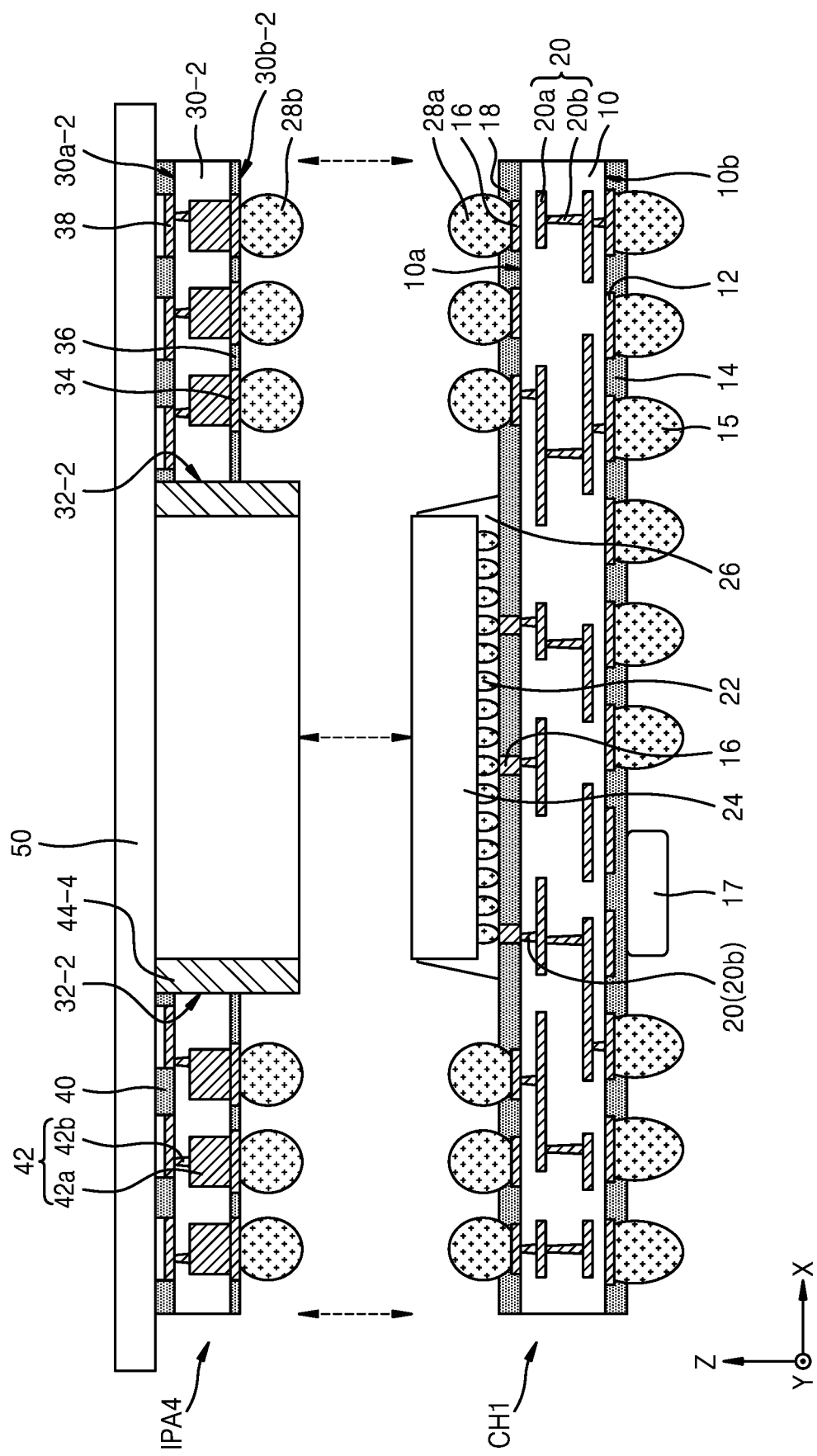
FIG. 17 is an exploded cross-sectional view illustrating a manufacturing process of adhering the interposer adhesive structure of FIGS. 16A and 16B and a semiconductor chip mounting structure of FIGS. 14A and 14B, according to an embodiment of the inventive concept.

FIGS. 16A and 16B are cross-sectional views illustrating the interposer adhesive structure IPA4 of FIGS. 14A and 14B, and FIG. 17 is an exploded cross-sectional view illustrating a manufacturing process of adhering the interposer adhesive structure IPA4 of FIGS. 16A and 16B and the semiconductor chip mounting structure CH1 of FIGS. 14A and 14B.

Specifically, in FIGS. 16A, 16B and 17, the same reference numerals as those of FIGS. 14A, 14B and 15 denote the same members. In FIGS. 16A, 16B, and 17, the same descriptions as those of FIGS. 14A, 14B and 15 are briefly given or omitted. FIG. 16B may be a cross-sectional view taken along line XVIb-XVIb' of FIG. 15.

The interposer adhesive structure IPA4 illustrated in FIG. 16A does not include the adhesive layer 44-4 for convenience. As described above, the interposer adhesive structure IPA4 may include the interposer substrate 30-2 having the penetration-type cavity 32-2. The interposer substrate 30-2 may include the upper surface 30a-2 and the lower surface 30b-2.

The penetration-type cavity 32-2 penetrating from the lower surface 30b-2 to the upper surface 30a-2 may be formed in the interposer substrate 30-2. The penetration-type cavity 32-2 may pass through fully between the lower surface 30b-2 and the upper surface 30a-2.

FIG. 16B illustrates adhering the adhesive layer 44-4 into the penetration-type cavity 32-2 of FIG. 16A. The adhesive layer 44-4 may not be filled in the entire penetration-type cavity 32-2 from a plan view, but may be positioned on both side surfaces of the penetration-type cavity 32-2. The adhesive layer 44-4 may include the first side adhesive layer 44b-4 and the second side adhesive layer 44c-4 formed on the side surfaces 24c and 24d of the semiconductor chip 24 (additional side adhesive layers may be included on the two sides not shown in FIGS. 16A and 16B). The lower surface 44r-3 (e.g., lowermost surfaces) of the adhesive layer 44-4 may be higher than the lower surface 24b (e.g., bottom surface) of the semiconductor chip 24 when provided in the penetration-type cavity 32-2. The adhesive layer 44-4 may use a semi-curable (B-Stage) thermosetting resin.

Here, the manufacturing process of adhering the interposer adhesive structure IPA4 of FIGS. 16A and 16B and the semiconductor chip mounting structure CH1 of FIGS. 14A and 14B to each other will be described with reference to FIG. 17.

As shown in FIG. 17, the interposer adhesive structure IPA4 of FIGS. 16A and 16B is positioned on the semiconductor chip mounting structure CH1 of FIGS. 14A and 14B. The interposer adhesive structure IPA4 may be attached to the film substrate 50. The film substrate 50 may be attached to the interposer upper protective layer 40, the interposer upper connection pad 38 and the adhesive layer 44-3 on the upper surface 30a-2 of the interposer substrate 30-2.

The semiconductor chip mounting structure CH1 and the interposer adhesive structure IPA4 attached to the film substrate 50 are closely adhered to each other. The lower connection bump 28a and the semiconductor chip 24 of the semiconductor chip mounting structure CH1 are aligned and adhered to the upper connection bump 28b and the adhesive layer 44-4 of the interposer adhesive structure IPA4, respectively.

When the semiconductor chip mounting structure CH1 and the interposer adhesive structure IPA4 attached to the film substrate 50 are closely adhered, the adhesive layer 44-4 provided on the interposer adhesive structure IPA4 may be impregnated or infiltrated on both side surfaces (24c and 24d in FIG. 14b) of the semiconductor chip 24 of the semiconductor chip mounting structure CH1, as well as on other side surfaces not shown.

Because the adhesive layer 44-4 uses a semi-curing (B-Stage) thermosetting resin, the adhesive layer 44-4 may be easily disposed on the side surfaces (e.g., 24c and 24d in FIG. 14b) of the semiconductor chip 24.

In addition, when the semiconductor chip mounting structure CH1 and the interposer adhesive structure IPA4 attached to the film substrate 50 are closely adhered, the semiconductor chip 24 and the interposer substrate 30-2 may be easily attached to each other due to the adhesive layer 44-4 included in the penetration-type cavity 32-2.

After the semiconductor chip mounting structure CH1 and the interposer adhesive structure IPA4 are closely adhered, the lower connection bump 28a and the upper connection bump 28b may result in manufacturing the connection bump 28 of FIG. 10A. In addition, after the semiconductor chip mounting structure CH1 and the interposer adhesive structure IPA4 are closely adhered and the adhesive layer 44-4 is cured, the semiconductor package structure PS4 may be manufactured as shown in FIGS. 14A and 14B.

Subsequently, after removing the film substrate 50, the molding layer 46 sealing between the semiconductor chip mounting structure CH1 and the interposer adhesive structure IPA4 of the semiconductor package structure PS4 may be formed as shown in FIG. 14A. The molding layer 46 may not be selectively formed.

Figure 18:
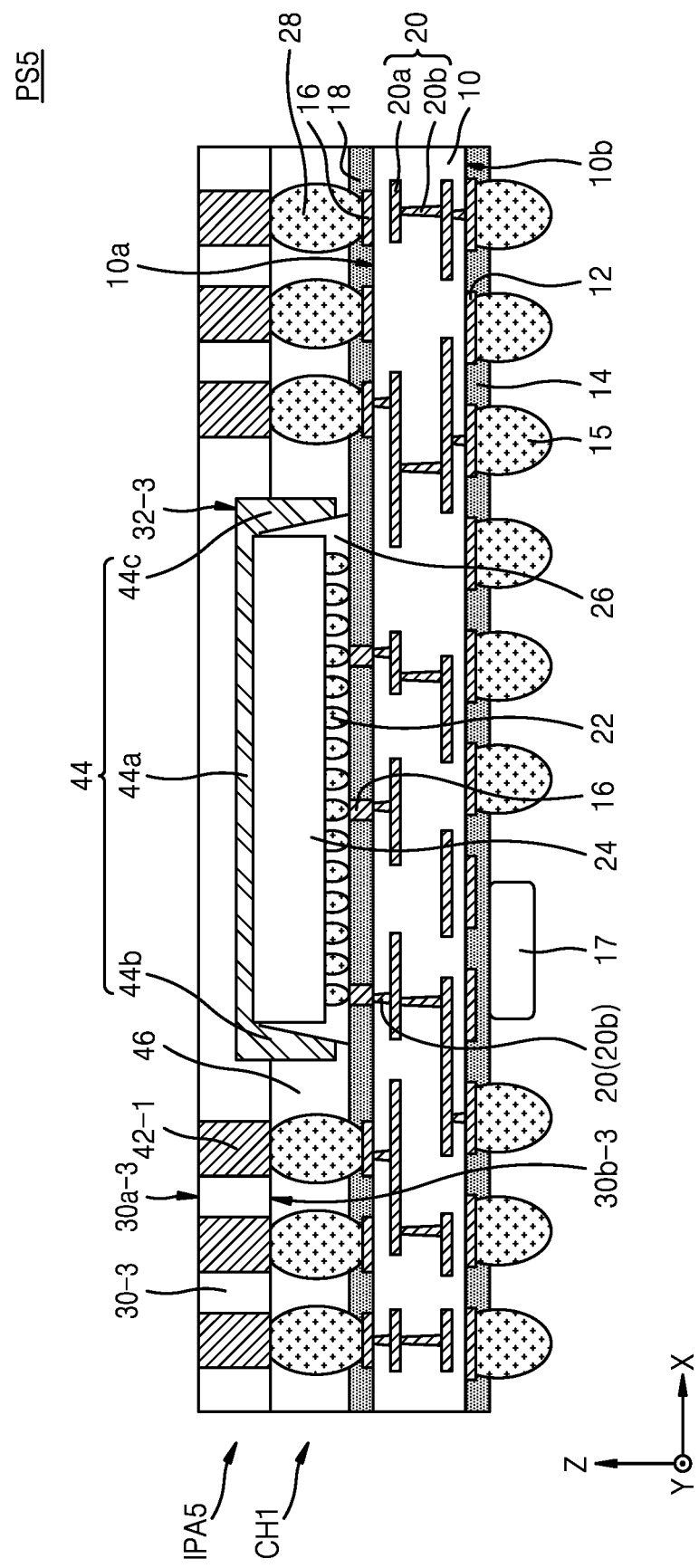
FIG. 18 is a cross-sectional view illustrating a semiconductor package structure according to an embodiment of the inventive concept.

FIG. 18 is a cross-sectional view illustrating a semiconductor package structure PS5 according to an embodiment of the inventive concept.

Specifically, the semiconductor package structure PS5 of FIG. 18 may be the same as the semiconductor package structure PS1 of FIGS. 1A and 1B except for a configuration of an interposer adhesive structure IPA5. In FIG. 18, the same reference numerals as those in FIGS. 1A and 1B denote the same members. In FIG. 18, the same descriptions as those of FIGS. 1A and 1B are briefly given or omitted.

The semiconductor package structure PS5 may include the semiconductor chip mounting structure CH1, the interposer adhesive structure IPA5 attached on the semiconductor chip mounting structure CH1, and the molding layer 46 sealing between the semiconductor chip mounting structure CH1 and the interposer adhesive structures IPA5. The semiconductor chip mounting structure CH1 has been described with reference to FIGS. 1A, 1B and 2, and thus a detailed description thereof will be omitted.

The interposer adhesive structure IPA5 may include an interposer substrate 30-3 including a cavity 32-3 and the adhesive layer 44. The interposer substrate 30-3 includes an upper surface 30a-3 and a lower surface 30b-3. The interposer substrate 30-3 may include the cavity 32-3 recessed inward from the lower surface 30b and corresponding to the semiconductor chip 24.

A through via 42-1 electrically connected to the connection bump 28 formed on the package substrate 10 may be in the interposer substrate 30-3. When the interposer substrate 30-3 includes a silicon substrate, the through via 42-1 may be a through silicon via (described more generally as a through substrate via). An additional semiconductor package structure may be easily mounted on the through via 42-1.

The adhesive layer 44 may be positioned inside and outside the cavity 32-3, and also formed on the upper surface (24a in FIG. 1B) and side surfaces (e.g., 24c and 24d in FIG. 1B, as well as side surfaces not shown) of the semiconductor chip 24. The adhesive layer 44 may include the upper adhesive layer 44a formed on the upper surface of the semiconductor chip 24, the first side adhesive layer 44b and the second side adhesive layer 44c respectively formed on the both side surfaces 24c and 24d of the semiconductor chip 24. Additional side adhesive layers may be formed on additional side surfaces (not shown) of the semiconductor chip 24.

Hereinafter, various application examples using a semiconductor package structure of the inventive concept will be described. The following application examples are illustrative, and the inventive concept is not limited thereto.

Figure 19:
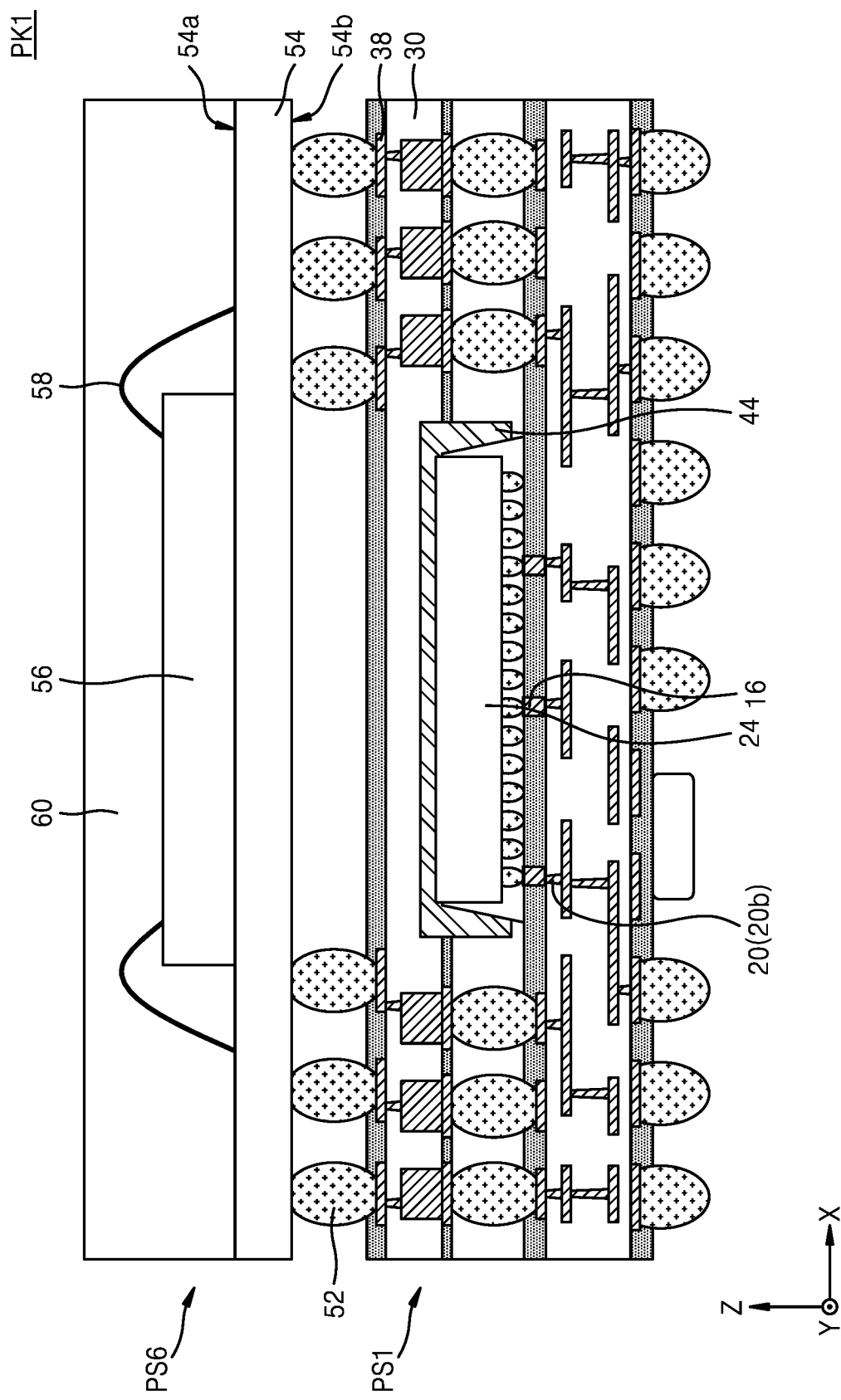
FIG. 19 is a cross-sectional view illustrating a stacked semiconductor package structure according to an embodiment of the inventive concept.

FIG. 19 is a cross-sectional view illustrating a stacked semiconductor package structure PK1 according to an embodiment of the inventive concept.

Specifically, the stacked semiconductor package structure PK1, also described as a semiconductor package, or package-on-package device includes the first semiconductor package structure PS1 and a second semiconductor package structure PS6. The first semiconductor package structure PS1 has been described with reference to FIGS. 1A, 1B and 2, and thus a detailed description thereof will be omitted.

In the present embodiment, the first semiconductor package structure PS1 is configured using FIGS. 1A, 1B and 2. However, the first semiconductor package structure of FIGS. 5A, 5B, 6A, 6B, 10A, 10B, 14A, and 14B may be configured.

The stacked semiconductor package structure PK1 is configured by stacking the second semiconductor package structure PS6 on the first semiconductor package structure PS1. The second semiconductor package structure PS6 may be electrically connected to the first semiconductor package structure PS1.

The second semiconductor package structure PS6 may include a second package substrate 54, an external connection bump 52, a second semiconductor chip 56, and a molding layer 60. The second package substrate 54 may include an upper surface 54a and a lower surface 54b. The second package substrate 54 may have the same types of components and a similar configuration as the package substrate 10. The second package substrate 54 may be a PCB.

A second external connection bump 52 may be provided on a lower surface of the second package substrate 54. The second external connection bump 52, also described as an external connection terminal, may be electrically connected to an interposer upper connection pad 38 of the interposer substrate 30. The second external connection bump 52 may be, for example, a solder ball.

The second semiconductor chip 56 may be positioned on the second package substrate 54 and may be electrically connected to the second package substrate 54 using a bonding wire 58. Alternatively, the second semiconductor chip 56 may be flip-chip bonded to the second package substrate 54. The second semiconductor chip 56 may be a logic chip or a memory chip. In some embodiments, when the first semiconductor chip 24 is the logic chip, the second semiconductor chip 56 may be the memory chip. In FIG. 19, the second semiconductor chip 56 is illustrated as one chip, but the second semiconductor chip 56 may be part of a stack of chips in which a plurality of chips are stacked.

The second molding layer 60 molds the second semiconductor chip 56 on the second package substrate 54. The second molding layer 60 serves to seal both the second semiconductor chip 56 and the bonding wire 58 positioned on the second package substrate 54. The second molding layer 60 may include the same material as the first molding layer 46 of FIGS. 1A, 1B, and 2. Though not shown, a molding layer may fill the space between the second package substrate 54 and interposer upper protective layer 40 (see FIG. 1A), and/or a molding layer may surround side surfaces of the stacked semiconductor package structure PK1, for example, for greater protection.

Figure 20:
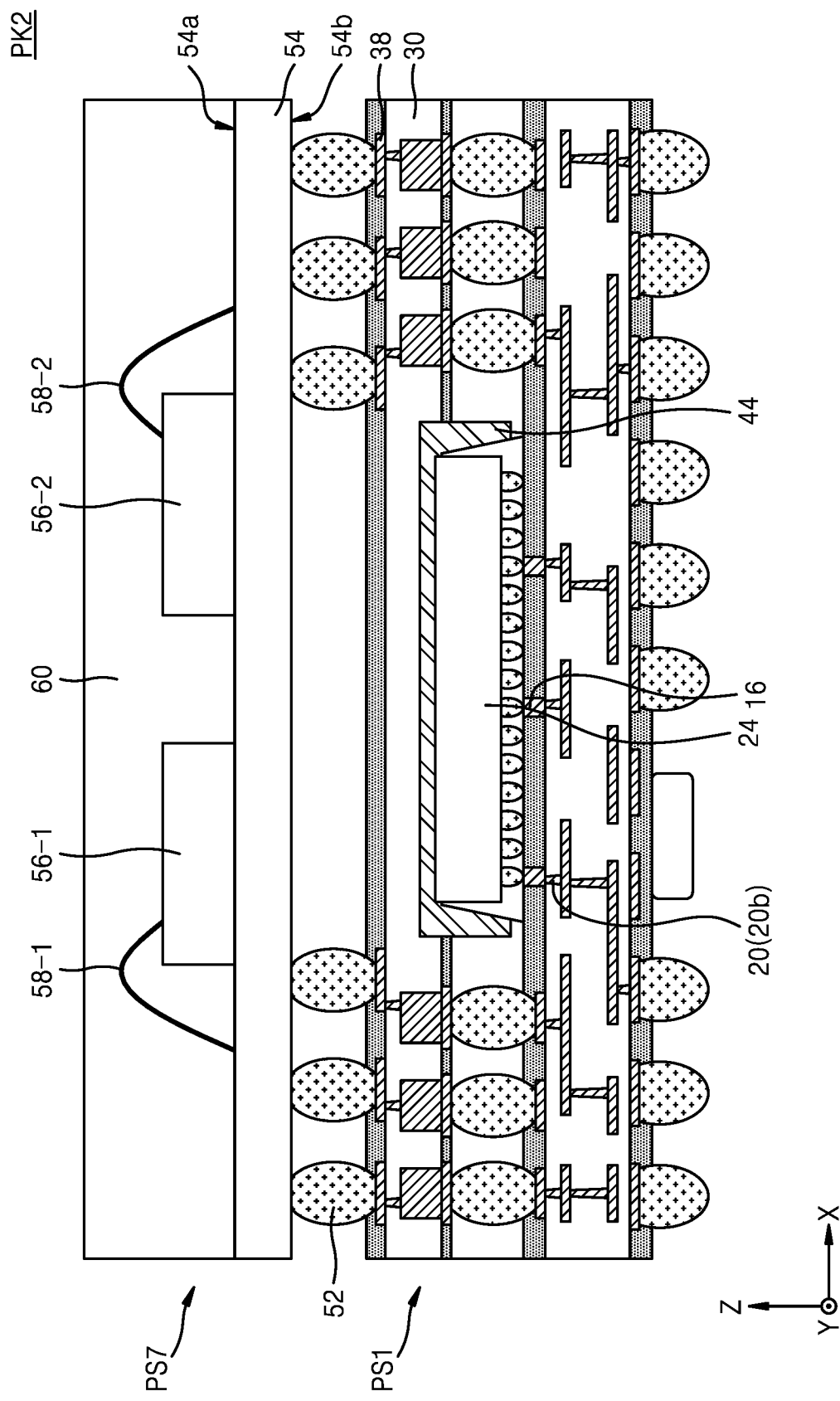
FIG. 20 is a cross-sectional view illustrating a stacked semiconductor package structure according to an embodiment of the inventive concept.

FIG. 20 is a cross-sectional view illustrating a stacked semiconductor package structure PK2 according to an embodiment of the inventive concept.

Specifically, the stacked semiconductor package structure PK2, also described as a semiconductor package, or package-on-package device, may be the same as the stacked semiconductor package structure PK1 of FIG. 19 except that a second semiconductor package structure PS7 includes two semiconductor chips horizontally spaced apart from each other, such as a second semiconductor chip 56-1 and a third semiconductor chip 56-2. More than two horizontally separated semiconductor chips may be included. In FIG. 20, the descriptions provided with reference to FIG. 19 are briefly given or omitted. The second semiconductor package structure PS7 may also include one or two (or more) stacks of chips, horizontally spaced apart from each other.

The stacked semiconductor package structure PK2 includes the first semiconductor package structure PS1 and the second semiconductor package structure PS7. The first semiconductor package structure PS1 has been described with reference to FIGS. 1A, 1B, and 2, and thus a detailed description thereof will be omitted.

The stacked semiconductor package structure PK2 is configured by stacking the second semiconductor package structure PS7 on the first semiconductor package structure PS1. The second semiconductor package structure PS7 may be electrically connected to the first semiconductor package structure PS1.

The second semiconductor package structure PS7 may include the second package substrate 54, the external connection bump 52, a second semiconductor chip 56-1, a third semiconductor chip 56-2, and the molding layer 60. The second package substrate 54 may include the upper surface 54a and the lower surface 54b. The second external connection bump 52 may be provided on a lower surface of the second package substrate 54. The second external connection bump 52 may be electrically connected to the interposer upper connection pad 38 of the interposer substrate 30. The second external connection bump 52 may be a solder ball.

The second semiconductor chip 56-1 may be positioned on the second package substrate 54 and may be electrically connected to the second package substrate 54 using a first bonding wire 58-1. The third semiconductor chip 56-2 may be positioned on the second package substrate 54 separately from the second semiconductor chip 56-1, and may be electrically connected to the second package substrate 54 using a second bonding wire 58-2. Alternatively, the second semiconductor chip 56-1 and the third semiconductor chip 56-2 may be flip-chip bonded to the second package substrate 54.

Each of the second semiconductor chip 56-1 and the third semiconductor chip 56-2 may be a logic chip or a memory chip. In some embodiments, when the first semiconductor chip 24 is the logic chip, the second semiconductor chip 56-1 and the third semiconductor chip 56-2 may be memory chips. In FIG. 20, each of the second semiconductor chip 56-1 and the third semiconductor chip 56-2 is illustrated as a single chip, but as mentioned above, each of the second semiconductor chip 56-1 and the third semiconductor chip 56-2 may be part of a stack chip in which a plurality of chips are stacked.

The second molding layer 60 may mold the second semiconductor chip 56-1 and the third semiconductor chip 56-2 on the second package substrate 54. The second molding layer 60 serves to seal all of the second semiconductor chip 56-1, the third semiconductor chip 56-2, the first bonding wire 58-1, and the second boding wire 58-2 positioned on the second package substrate 54-2. The second molding layer 60 may include the same material as the first molding layer 46 of FIGS. 1A, 1B, and 2. Though not shown, a molding layer may fill the space between the second package substrate 54 and interposer upper protective layer 40 (see FIG. 1A), and/or a molding layer may surround side surfaces of the stacked semiconductor package structure PK2, for example, for greater protection.

Figure 21:
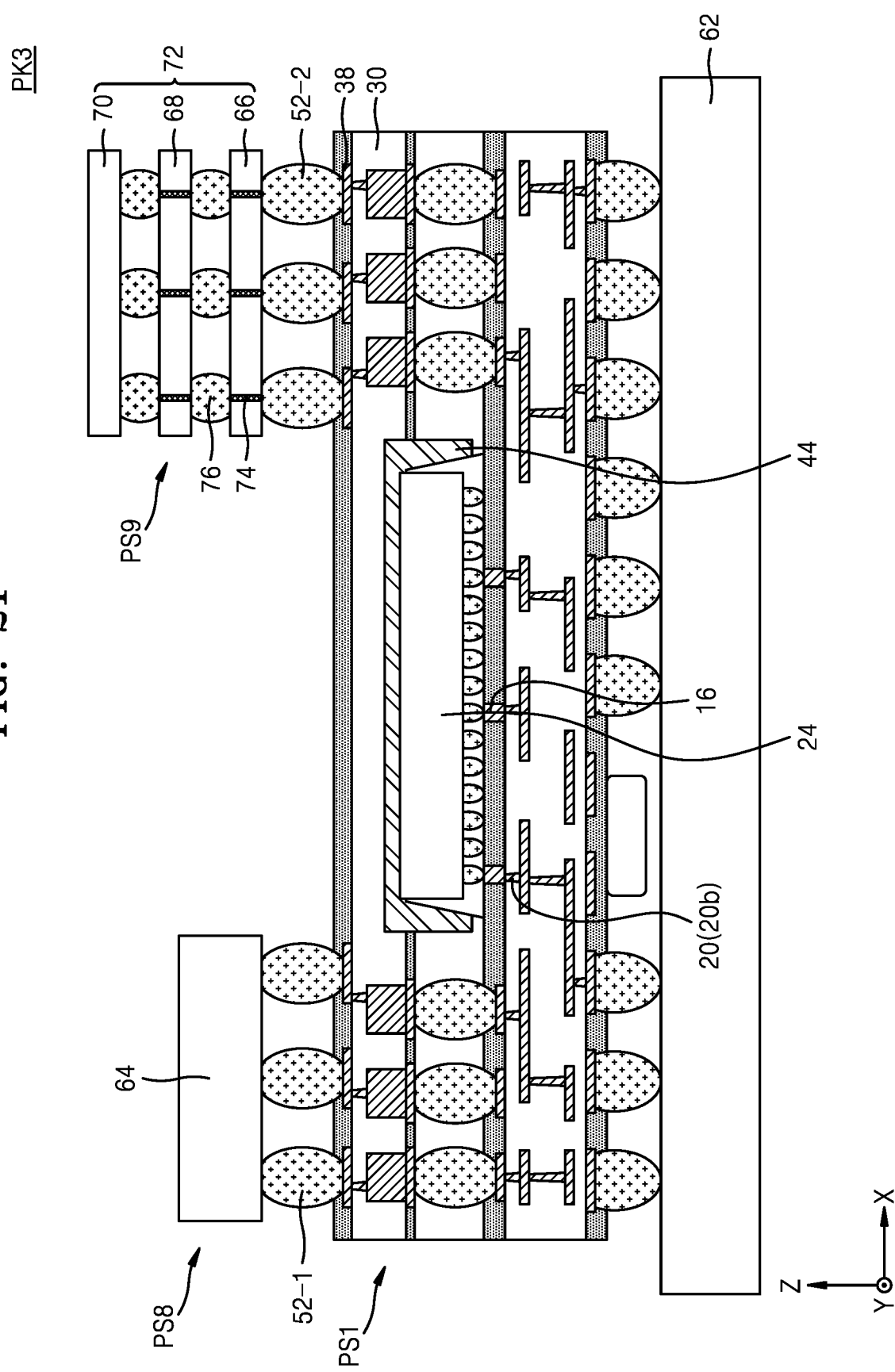
FIG. 21 is a cross-sectional view illustrating a stacked semiconductor package structure according to an embodiment of the inventive concept.

FIG. 21 is a cross-sectional view illustrating a stacked semiconductor package structure PK3 according to an embodiment of the inventive concept.

Specifically, the stacked semiconductor package structure PK3, also described as a semiconductor package, or package-on-package device, includes a main board substrate 62, the first semiconductor package structure PS1, a second semiconductor package structure PS8, and a third semiconductor package structure PS9.

The first semiconductor package structure PS1 may be mounted on the main board substrate 62. The main board substrate 62 may be a PCB. The first semiconductor package structure PS1 has been described with reference to FIGS. 1A, 1B, and 2, and thus a detailed description thereof will be omitted. In the present embodiment, the first semiconductor package structure PS1 is configured using FIGS. 1A, 1B and 2. However, the first semiconductor package structure of FIGS. 5A, 5B, 6A, 6B, 10A, 10B, 14A, and 14B may be configured.

The stacked semiconductor package structure PK3 stacks the second semiconductor package structure PS8 and the third semiconductor package structure PS9 on the first semiconductor package structure PS1. The second semiconductor package structure PS8 and the third semiconductor package structure PS9 are configured to be spaced apart from each other in the horizontal direction, for example, the X direction.

The second semiconductor package structure PS8 includes a second semiconductor chip 64 and a second external connection bumps 52-1. The second external connection bumps 52-1 may be electrically connected to the interposer upper connection pad 38 of the interposer substrate 30. The second external connection bumps 52-1 may be solder balls, for example. The second semiconductor chip 64 may be a logic chip.

The third semiconductor package structure PS9 includes a third semiconductor chip 72 and a third external connection bumps 52-2. The third external connection bumps 52-2 may be electrically connected to the interposer upper connection pads 38 of the interposer substrate 30. The third external connection bumps 52-2 may be solder balls, for example. The third semiconductor chip 72 may include a first sub-chip 66, a second sub-chip 68, and a third sub-chip 70. The first sub chip 66, the second sub chip 68, and the third sub chip 70 may be electrically connected to each other through a sub bump 76 and a sub through via 74. The sub through via 74 may be a sub silicon through via.

The first sub-chip 66, the second sub-chip 68, and the third sub-chip 70 may be memory chips. Although three sub-chips are illustrated in FIG. 21, more sub-chips may be stacked. As with FIGS. 20 and 21, an additional molding layer may be formed to surround side surfaces of the stacked semiconductor package PK3, and in some embodiments to fill in spaces between the different semiconductor chips and substrates.

Figure 22:
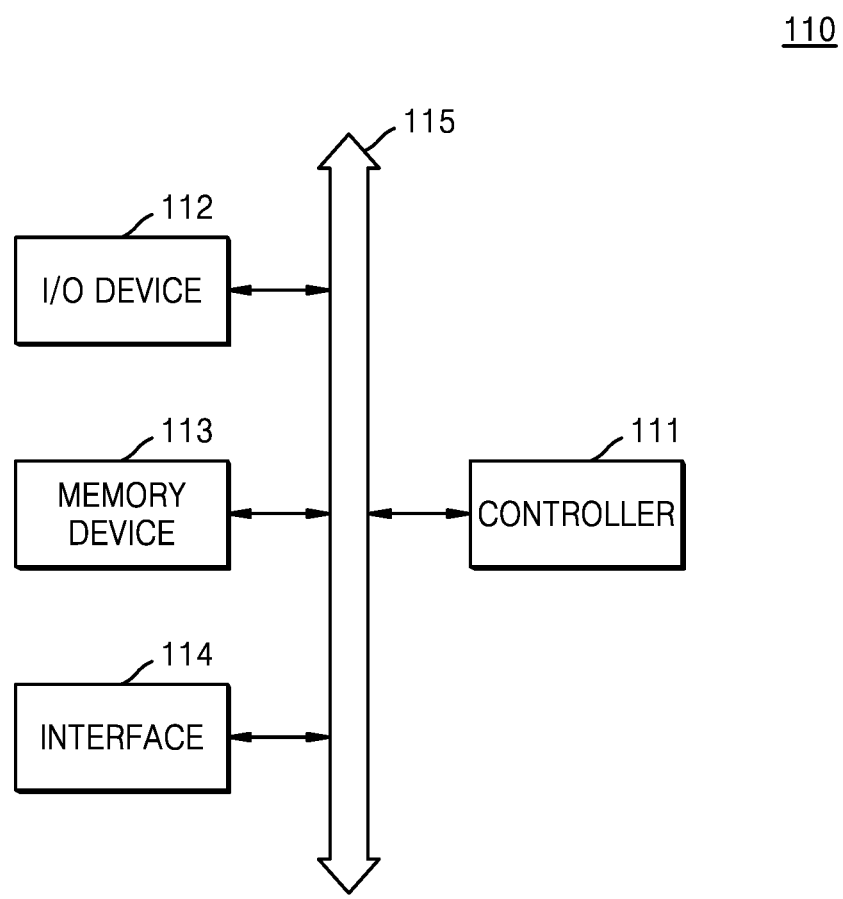
FIG. 22 is a schematic block diagram illustrating an example of a memory system including semiconductor package structures according to an embodiment of the inventive concept.

FIG. 22 is a schematic block diagram illustrating an example of a memory system 110 including one or more of the semiconductor package structures PS1 to PS5 according to an embodiment of the inventive concept.

Specifically, the memory system 110 may be applied to a personal digital assistant (PDA), a portable computer (portable computer), a web tablet, a wireless phone, a mobile phone, a digital music player, a memory card, or all devices capable of transmitting and/or receiving information in a wireless environment.

The memory system 110 includes a controller 111, an input/output (I/O) device 112 such as a keypad, a keyboard, and a display, a memory device 113, an interface 114, and a bus 115. The memory device 113 and the interface 114 communicate with each other via the bus 115.

The controller 111 includes at least one microprocessor, a digital signal processor, a microcontroller, or other processing devices similar thereto. The memory device 113 may be used to store a command executed by the controller 111. The I/O device 112 may receive data or signals from the outside of the memory system 110 or may output data or signals to the outside of the memory system 110. For example, the I/O device 112 may include the keyboard, the keypad, or the display.

The memory device 113 and the controller 111 may include one or more of the semiconductor package structures PS1 to PS5 according to an embodiment of the inventive concept. The memory device 113 may further include other types of memories, such as volatile memories that may be accessed at any time, and other various types of memories. The interface 114 serves to transmit data to or receive data from a communication network.

Figure 23:
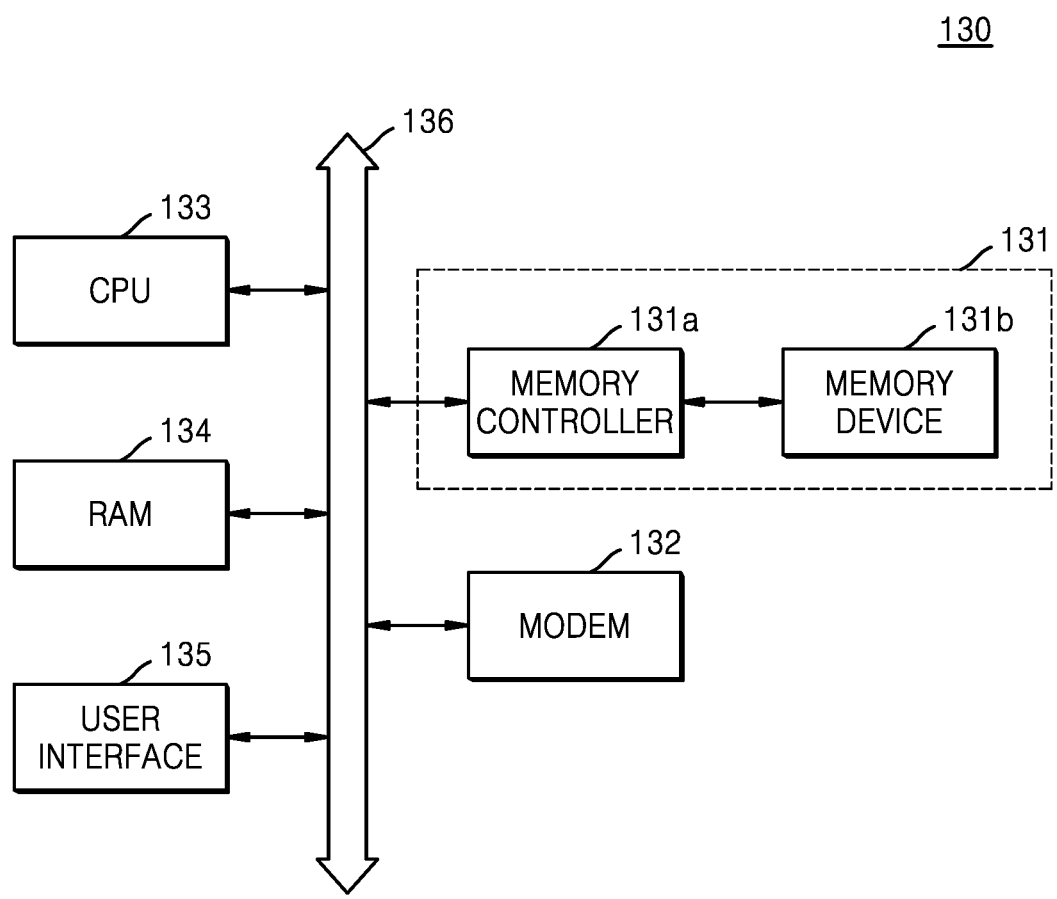
FIG. 23 is a schematic block diagram illustrating an example of an information processing system including semiconductor package structures according to an embodiment of the inventive concept.

FIG. 23 is a schematic block diagram illustrating an example of an information processing system 130 including one or more of the semiconductor package structures PS1 to PS5 according to an embodiment of the inventive concept.

Specifically, the information processing system 130 may be used in a mobile device or a desktop computer. The information processing system 130 may include a memory system 131 including a memory device 131a and a memory controller 131b.

The information processing system 130 includes a MOdulator and DEModulator (MODEM) 132 electrically connected to a system bus 136, a central processing unit 133, a RAM 134, and a user interface 135. Data processed by the central processing unit 133 or data input from the outside is stored in the memory system 131.

The memory system 131 including the memory device 131a and the memory controller 131b, the MODEM 132, the central processing unit 133, and the RAM 134 may include one or more of the semiconductor package structures PS1 to PS5 according to an embodiment of the inventive concept.

The memory system 131 may be configured as a solid state drive, and in this case, the information processing system 130 may stably store a large amount of data in the memory system 131. In addition, as reliability increases, the memory system 131 may reduce resources required for error correction, thereby providing a high-speed data exchange function to the information processing system 130. Although not shown, an application chipset, a camera image signal processor (ISP), an I/O device, etc. may be further provided to the information processing system 130.

While the inventive concept has been particularly shown and described with reference to embodiments thereof, it will be understood that various changes in form and details may be made therein without departing from the spirit and scope of the following claims.

Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

What is claimed is:

1. A semiconductor package structure comprising:
a package substrate;
a semiconductor chip on the package substrate and electrically connected to the package substrate;
an interposer substrate above the package substrate and the semiconductor chip, wherein the interposer substrate comprises a cavity recessed inward from a lower surface thereof, wherein the semiconductor chip is positioned within the cavity, at least from a plan view; and
an adhesive layer positioned inside and outside the cavity, wherein the adhesive layer is formed on both an upper surface and side surfaces of the semiconductor chip.

2. The semiconductor package structure of claim 1, wherein the adhesive layer comprises a die attachment film (DAF) or a film on die (FOD).

3. The semiconductor package structure of claim 1, wherein an upper portion of the semiconductor chip is partially positioned in the cavity.

4. The semiconductor package structure of claim 1, wherein a lower surface of the adhesive layer formed on the side surfaces of the semiconductor chip is lower than a bottom surface of the semiconductor chip.

5. The semiconductor package structure of claim 1, wherein the adhesive layer extends to have a first width from one side of the semiconductor chip and a second width from another side of the semiconductor chip, the second width being different from the first width.

6. The semiconductor package structure of claim 1, wherein a lower surface of the adhesive layer formed on the side surfaces of the semiconductor chip has a rounded shape.

7. The semiconductor package structure of claim 1, further comprising a plurality of patch patterns spaced apart from each other on the cavity and inside the adhesive layer on an upper surface of the semiconductor chip.

8. The semiconductor package structure of claim 1, wherein the cavity is configured as a penetration-type cavity fully penetrating through the interposer substrate, and wherein the adhesive layer is filled infills the penetration-type cavity.

9. The semiconductor package structure of claim 1, further comprising a molding layer sealing both the semiconductor chip and the adhesive layer between an upper surface of the package substrate and the lower surface of the interposer substrate.

10. The semiconductor package structure of claim 1, further comprising:
a connection bump on the package substrate; and
a through via formed inside the interposer substrate and electrically connected to the connection bump.

11. A semiconductor package comprising:
a semiconductor chip mounting structure comprising a package substrate, a semiconductor chip on the package substrate, and lower connection bumps on the package substrate and surrounding the semiconductor chip; and
an interposer adhesive structure attached onto the semiconductor chip mounting structure,
wherein the interposer adhesive structure comprises an interposer substrate having a cavity recessed inward from a lower surface thereof and corresponding to the semiconductor chip; an adhesive layer positioned inside and outside the cavity and on both an upper surface and opposite side surfaces of the semiconductor chip, or on the opposite side surfaces of the semiconductor chip and not on the upper surface; and upper connection bumps electrically connected to the lower connection bumps on the interposer substrate and surrounding the cavity; and
a molding layer sealing between the semiconductor chip mounting structure and the interposer adhesive structure.

12. The semiconductor package of claim 11, wherein a horizontal width of the cavity in a first direction is greater than a horizontal width of the semiconductor chip in the first direction.

13. The semiconductor package of claim 11, wherein the adhesive layer comprises a die attachment film (DAF) or a film on die (FOD) of a thermosetting resin, and wherein the adhesive layer is formed by impregnating or infiltrating the thermosetting resin on the upper surface and the opposite side surfaces of the semiconductor chip.

14. The semiconductor package of claim 11, wherein the adhesive layer comprises a first side adhesive layer and a second side adhesive layer respectively on a first side and a second side of the semiconductor chip, and wherein the first side adhesive layer and the second side adhesive layer have an asymmetric structure with respect to a center of the semiconductor chip.

15. The semiconductor package of claim 11, further comprising a plurality of patch patterns spaced apart from each other inside the adhesive layer on the upper surface of the semiconductor chip.

16. The semiconductor package of claim 11, wherein the cavity is configured as a penetration-type cavity fully penetrating the interposer substrate, and wherein the adhesive layer fills an entire area from a plan view of the penetration-type cavity or is configured to expose the upper surface of the semiconductor chip.

17. The semiconductor package of claim 11, further comprising through-vias electrically connected to the lower connection bumps and the upper connection bumps inside the interposer substrate.

18. A stacked semiconductor package comprising:
a first semiconductor package structure; and
a second semiconductor package structure on the first semiconductor package structure,
wherein the first semiconductor package structure comprises
a first package substrate;
a first semiconductor chip on the first package substrate and electrically connected to the first package substrate;
an interposer substrate above the first package substrate and the first semiconductor chip, wherein the interposer substrate comprises a cavity recessed inward from a lower surface thereof, and wherein the first semiconductor chip is positioned to correspond to the cavity; and
an adhesive layer positioned inside and outside the cavity, wherein the adhesive layer is formed on both an upper surface and at least two opposite side surfaces of the first semiconductor chip, and
wherein the second semiconductor package structure comprises:
a second package substrate;
an external connection bump on a lower surface of the second package substrate and electrically connected to the interposer substrate; and
a second semiconductor chip on an upper surface of the second package substrate and electrically connected to the second package substrate.

19. The stacked semiconductor package of claim 18, further comprising a first molding layer sealing both the first semiconductor chip and the adhesive layer between an upper surface of the first package substrate and the lower surface of the interposer substrate, and
a second molding layer sealing the second semiconductor chip on the second package substrate.

* * * * *